(12) United States Patent
Lee et al.

(10) Patent No.: US 12,520,484 B2
(45) Date of Patent: Jan. 6, 2026

(54) SEMICONDUCTOR DEVICES

(71) Applicant: Samsung Electronics Co., Ltd., Suwon-si (KR)

(72) Inventors: Hongjun Lee, Suwon-si (KR); Kang-Uk Kim, Seoul (KR); Hoouk Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 424 days.

(21) Appl. No.: 17/724,901

(22) Filed: Apr. 20, 2022

(65) Prior Publication Data
US 2023/0070835 A1    Mar. 9, 2023

(30) Foreign Application Priority Data

Sep. 3, 2021    (KR) .................. 10-2021-0117866

(51) Int. Cl.
H10B 12/00    (2023.01)
(52) U.S. Cl.
CPC ............ *H10B 12/50* (2023.02); *H10B 12/09* (2023.02); *H10B 12/315* (2023.02); *H10B 12/34* (2023.02)
(58) Field of Classification Search
CPC .. H10B 12/0335; H10B 12/09; H10B 12/315; H10B 12/34; H10B 12/482; H10B 12/50
See application file for complete search history.

(56) References Cited

U.S. PATENT DOCUMENTS

| | | | |
|---|---|---|---|
| 6,563,162 B2 | 5/2003 | Han et al. | |
| 6,815,300 B2 | 11/2004 | Jeong et al. | |
| 6,960,523 B2 | 11/2005 | Maldei et al. | |
| 7,709,367 B2 | 5/2010 | Lee et al. | |
| 7,749,834 B2 | 7/2010 | Park et al. | |
| 10,347,644 B2 * | 7/2019 | Chang | H10B 12/033 |
| 10,553,582 B2 | 2/2020 | Kim et al. | |
| 10,707,215 B2 | 7/2020 | Simsek-Ege et al. | |
| 10,714,478 B2 | 7/2020 | Ryu et al. | |
| 2006/0022237 A1 | 2/2006 | Byun et al. | |
| 2008/0308954 A1 | 12/2008 | Seo | |
| 2015/0004774 A1 | 1/2015 | Kang | |
| 2017/0317079 A1* | 11/2017 | Kim | H01L 27/088 |
| 2020/0203354 A1* | 6/2020 | Lee | H10B 12/02 |
| 2020/0402982 A1* | 12/2020 | Park | H10B 12/315 |
| 2021/0057339 A1* | 2/2021 | Lee | H01L 23/5228 |

(Continued)

FOREIGN PATENT DOCUMENTS

| | | |
|---|---|---|
| KR | 100150987 B1 | 10/1998 |
| KR | 100155886 B1 | 10/1998 |

(Continued)

*Primary Examiner* — Meiya Li
(74) *Attorney, Agent, or Firm* — Wolf, Greenfield & Sacks, P.C.

(57) ABSTRACT

A semiconductor device may include a substrate including a cell region and a peripheral region, bit lines on the cell region and extending in a first direction parallel to a top surface of the substrate, a lower capping pattern on a top surface of each of the bit lines, a bit line spacer on a side surface of each of the bit lines and extending to a side surface of the lower capping pattern, and a respective upper capping pattern on a top surface of the lower capping pattern. The respective upper capping pattern is on at least a portion of a top surface of the bit line spacer.

20 Claims, 23 Drawing Sheets

(56) References Cited

U.S. PATENT DOCUMENTS

2021/0098460 A1    4/2021  Lee et al.
2021/0273048 A1    9/2021  Park et al.
2021/0296237 A1*  9/2021  Kim .................... H10B 12/053

FOREIGN PATENT DOCUMENTS

| | | |
|---|---|---|
| KR | 100170312 B1 | 2/1999 |
| KR | 20030058602 A | 7/2003 |
| KR | 20030058675 A | 7/2003 |
| KR | 20030088326 A | 11/2003 |
| KR | 100464414 B1 | 1/2005 |
| KR | 20140062601 A | 5/2014 |
| KR | 20170123378 A | 11/2017 |

\* cited by examiner

SEMICONDUCTOR DEVICES

CROSS-REFERENCE TO RELATED APPLICATION(S)

This U.S. non-provisional patent application claims priority under 35 U.S.C. § 119 to Korean Patent Application No. 10-2021-0117866, filed on Sep. 3, 2021, in the Korean Intellectual Property Office, the entire contents of which are hereby incorporated by reference.

BACKGROUND

The present disclosure relates to semiconductor devices. Due to their small-size, multifunctional, and/or low-cost characteristics, semiconductor devices are considered important elements in the electronics industry. Semiconductor devices may be classified into a semiconductor memory device for storing data, a semiconductor logic device for processing data, and a hybrid semiconductor device including both memory and logic elements.

With the recent trend of high speed and low power consumption of electronic devices, demand may be high for semiconductor devices embedded in the electronic devices that also have high operating speeds and/or low operating voltages. In response to this demand, an integration density of semiconductor devices may be increased. However, the increase of the integration density of a semiconductor device may cause an increase of difficulty or failure rate in a process of fabricating a semiconductor device. As a result of the increased integration density of the semiconductor device, the production yield and operating characteristics of the semiconductor device may decrease. Accordingly, many studies are being conducted to improve the production yield and operating reliability of semiconductor devices.

SUMMARY

An embodiment of the inventive concept provides a semiconductor device with improved electrical characteristics and a method of fabricating the same.

An embodiment of the inventive concept provides a semiconductor device, which can be easily fabricated, and a method of fabricating the same.

According to an embodiment of the inventive concept, a semiconductor device may include a substrate including a cell region and a peripheral region, bit lines on the cell region and extending in a first direction parallel to a top surface of the substrate, a respective lower capping pattern on a top surface of each of the bit lines, a respective bit line spacer on a side surface of each of the bit lines and extending to a side surface of the respective lower capping pattern, and a respective upper capping pattern on a top surface of the respective lower capping pattern. The respective upper capping pattern is on at least a portion of a top surface of the respective bit line spacer.

According to an embodiment of the inventive concept, a method of fabricating a semiconductor device may include preparing a substrate including a cell region and a peripheral region, forming bit lines and lower capping patterns on the cell region to extend in a first direction parallel to a top surface of the substrate, forming bit line spacers to cover side surfaces of the bit lines and side surfaces of the lower capping patterns, forming line patterns between adjacent ones of the bit line spacers to extend in the first direction, etching the line patterns to form preliminary storage node contacts, which are spaced apart from each other in the first direction and a second direction that is parallel to the top surface of the substrate and is perpendicular to the first direction, forming an upper capping layer to cover top surfaces of the bit line spacers and top surfaces of the preliminary storage node contacts, etching the upper capping layer to form a preliminary upper capping pattern having openings exposing the preliminary storage node contacts, respectively, and etching the preliminary storage node contacts, which are exposed by the openings, to form storage node contacts. The preliminary upper capping pattern may remain on the lower capping patterns after etching the preliminary storage node contacts.

A semiconductor device, according to some embodiments, may include a substrate. The semiconductor device may include a plurality of bit lines on the substrate. The semiconductor device may include a plurality of lower capping patterns on top of the bit lines. The semiconductor device may include a plurality of upper capping patterns on top of the lower capping patterns. Moreover, the semiconductor device may include a plurality of bit line spacers on side surfaces of the bit lines, side surfaces of the lower capping patterns, and bottom surfaces of the upper capping patterns.

A semiconductor device, according to some embodiments, may include a substrate. The semiconductor device may include first and second bit lines on the substrate. The semiconductor device may include first and second lower capping patterns on top of the first and second bit lines, respectively. The semiconductor device may include first and second upper capping patterns on top of the first and second lower capping patterns, respectively. Moreover, the semiconductor device may include first and second bit line spacers contacting respective bottom surfaces of the first and second upper capping patterns.

DETAILED DESCRIPTION

Example embodiments of the inventive concepts will now be described more fully with reference to the accompanying drawings, in which example embodiments are shown.

Figure 1:
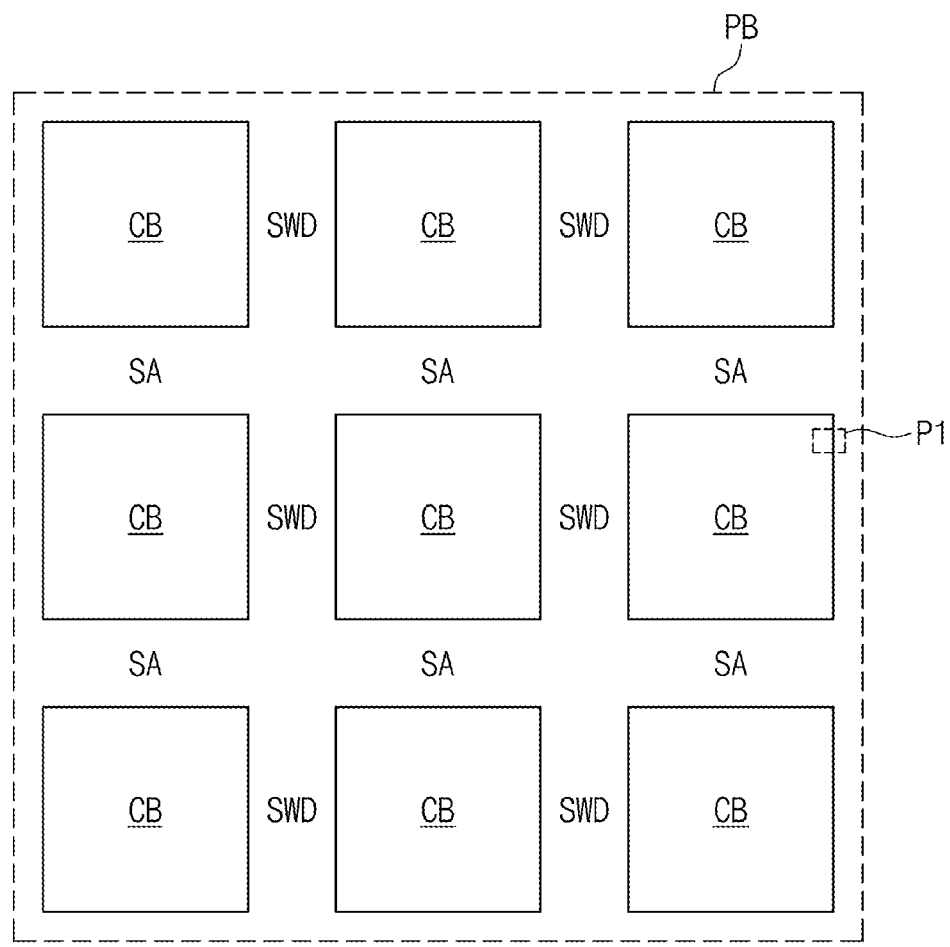
FIG. 1 is a block diagram illustrating a semiconductor device according to an embodiment of the inventive concept.

FIG. 1 is a block diagram illustrating a semiconductor device according to an embodiment of the inventive concept.

Referring to FIG. 1, a semiconductor device may include cell blocks CB and a peripheral block PB, which is provided to surround each of the cell blocks CB. The semiconductor device may be a memory device, and each of the cell blocks CB may include a cell circuit (e.g., a memory integrated circuit). The peripheral block PB may include various peripheral circuits, which are used to operate the cell circuit, and the peripheral circuits may be electrically connected to the cell circuit.

The peripheral block PB may include sense amplifier circuits SA and sub-word line driver circuits SWD. In an embodiment, the sense amplifier circuits SA may be provided to face each other with the cell blocks CB interposed therebetween, and the sub-word line driver circuits SWD may be provided to face each other with the cell blocks CB interposed therebetween. The peripheral block PB may further include power and ground circuits for driving a sense amplifier, but the inventive concept is not limited to this example.

Figure 2:
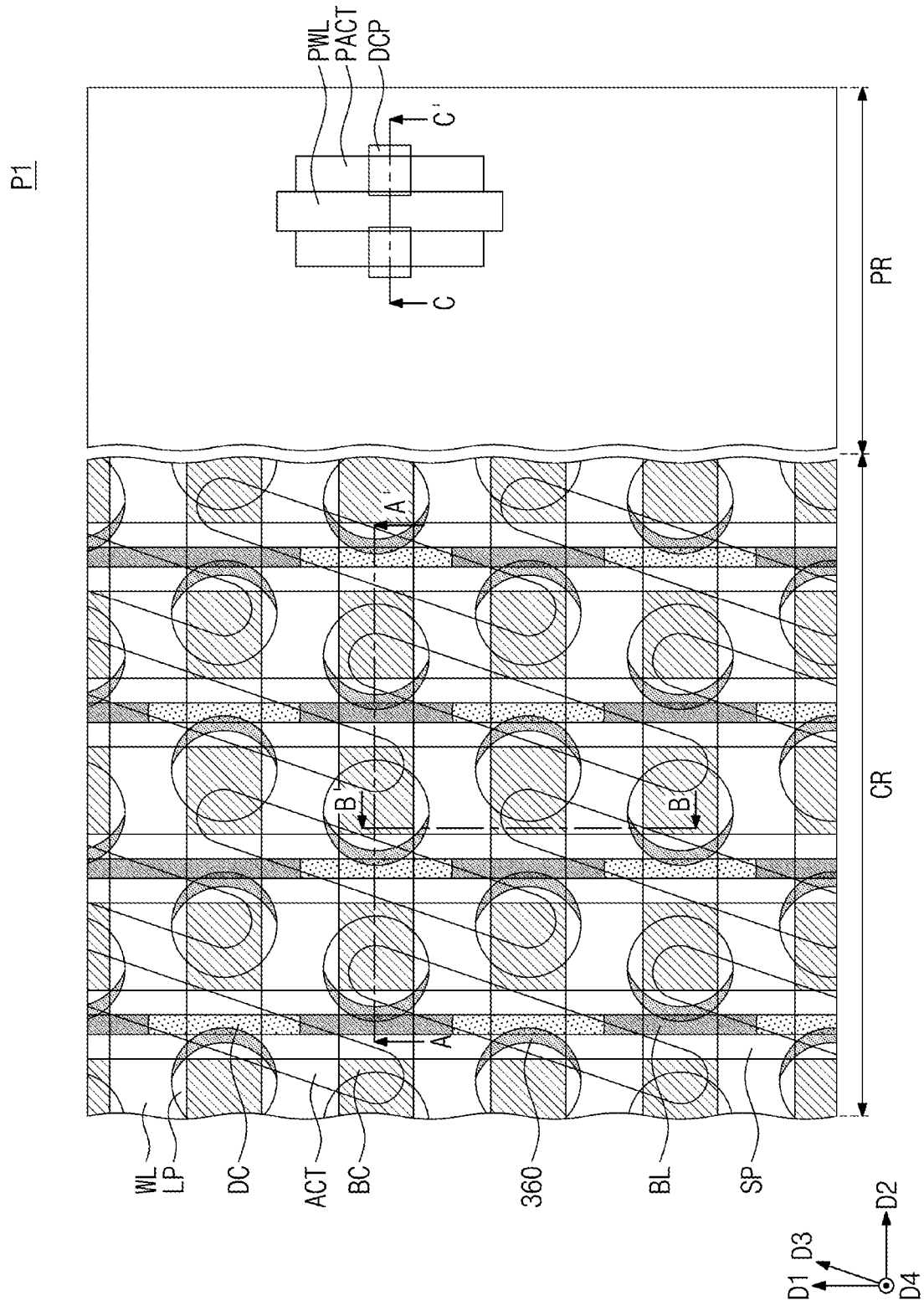
FIG. 2 is a plan view that illustrates a semiconductor device according to an embodiment of the inventive concept and corresponds to a portion 'P1' of FIG. 1.
Figure 3:
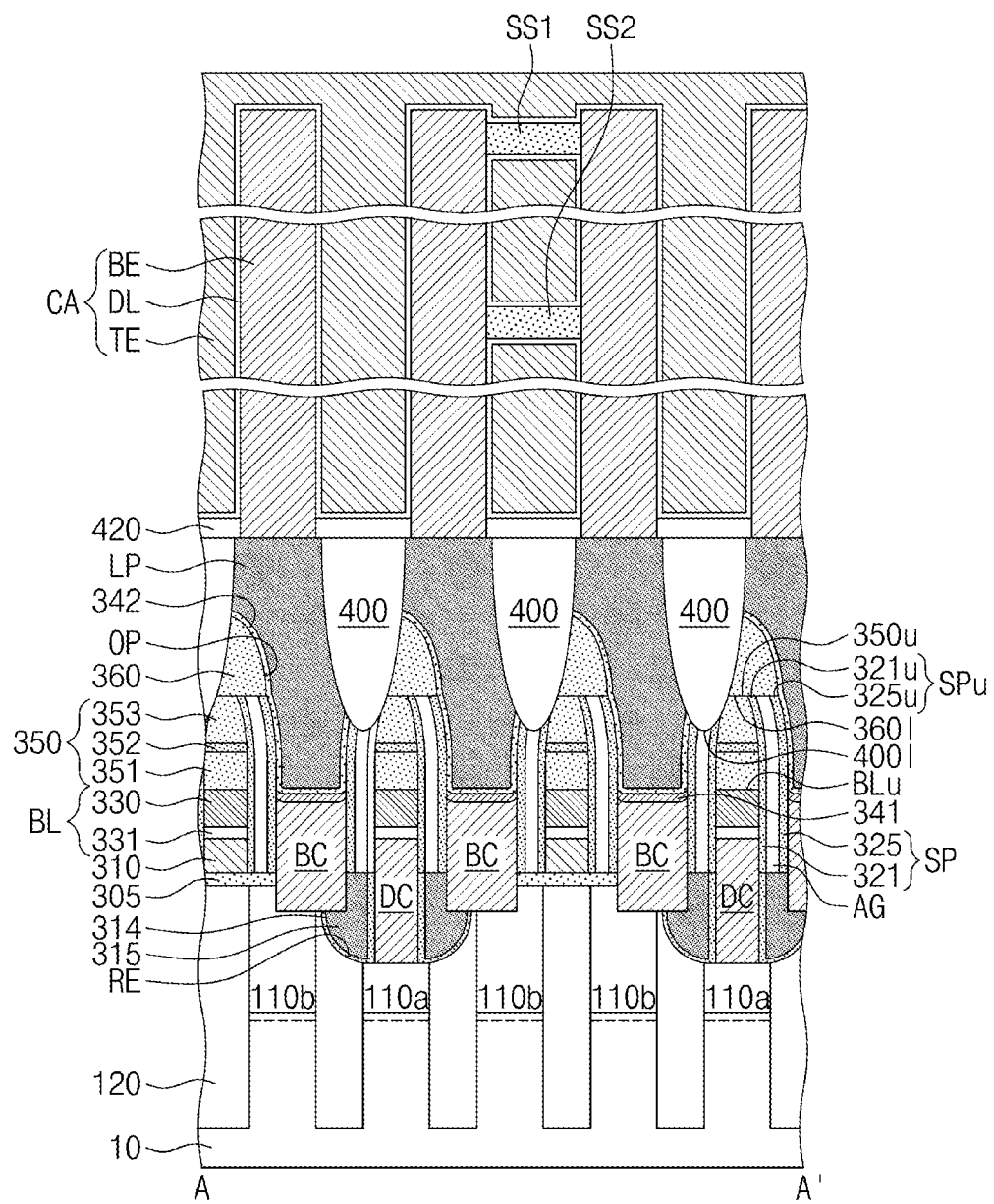
FIGS. 3 to 5 are sectional views which are respectively taken along lines A-A', B-B', and C-C' of FIG. 2.
Figure 4:
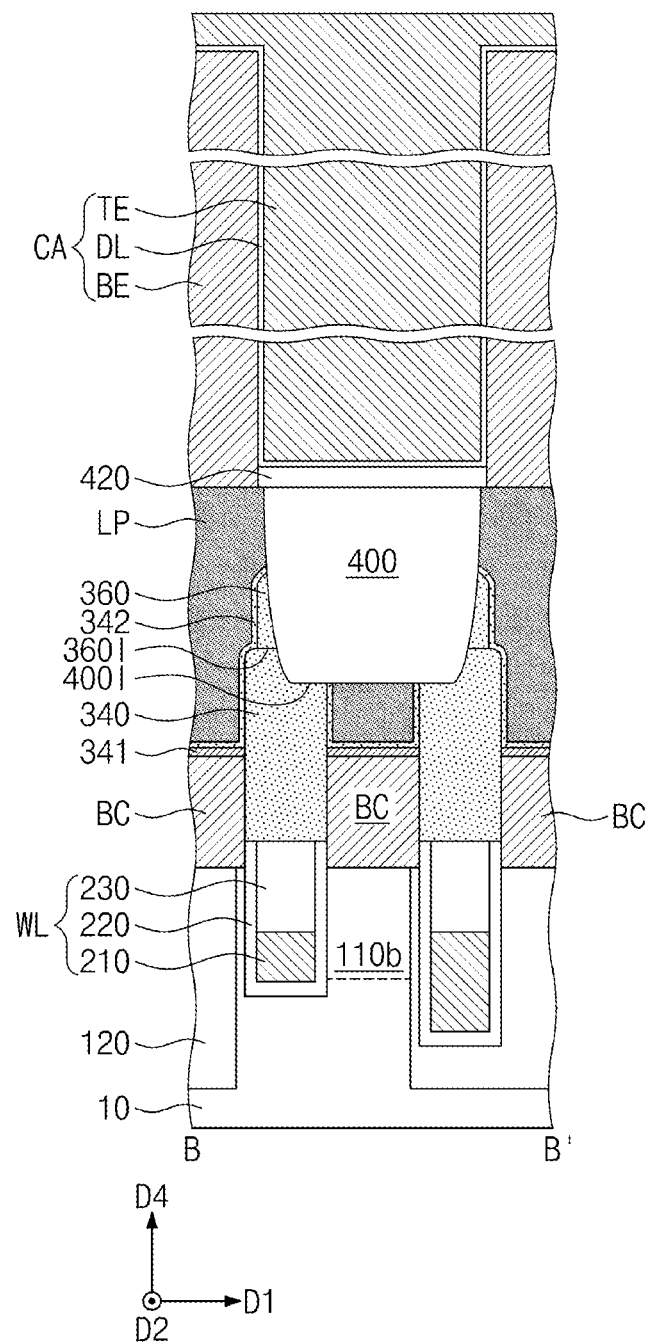
Figure 5:
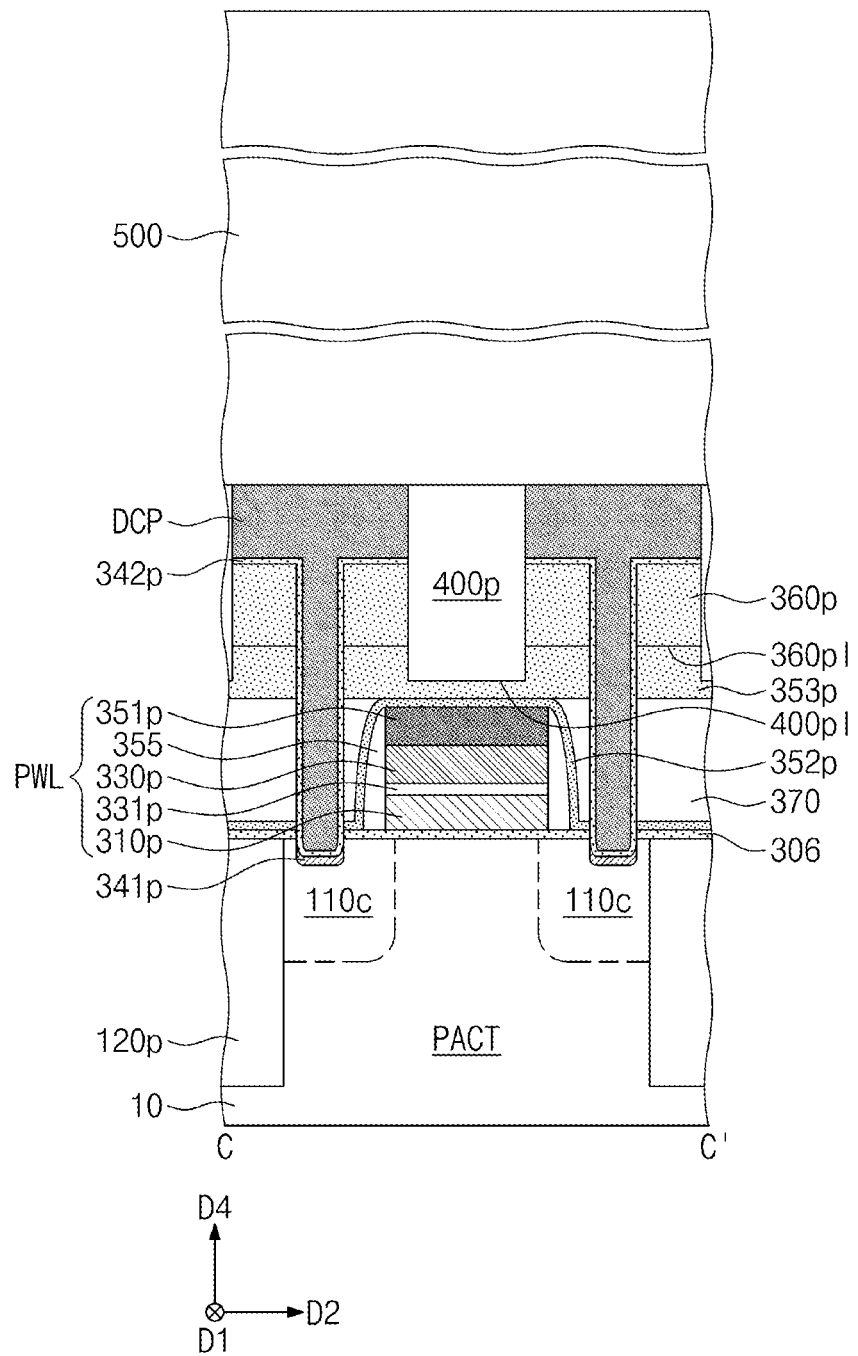
Figure 6:
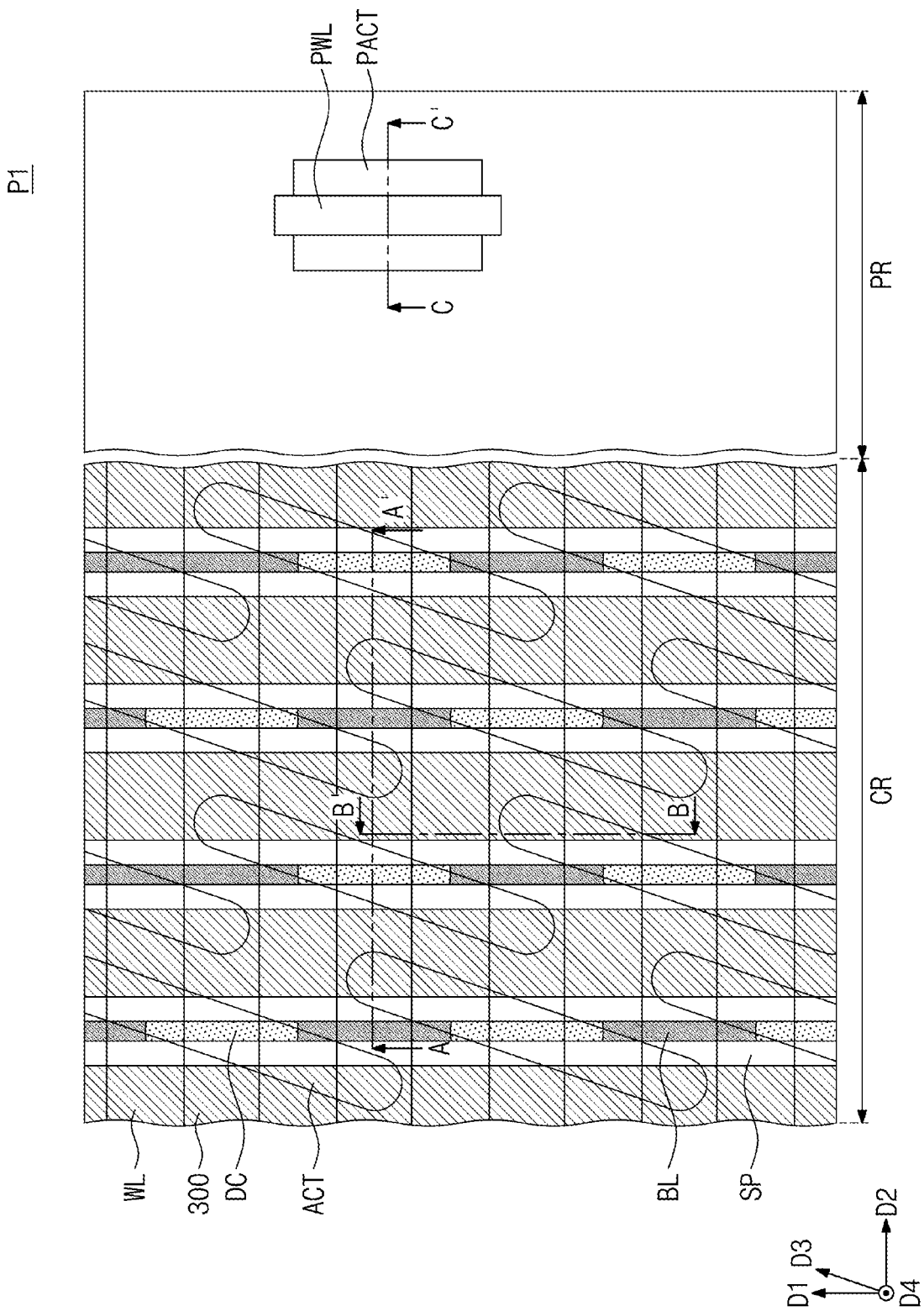
FIGS. 6, 10, 14, 18, and 22 are plan views which illustrate a method of fabricating a semiconductor device according to an embodiment of the inventive concept and correspond to a portion 'P1' of FIG. 1.
Figure 7:
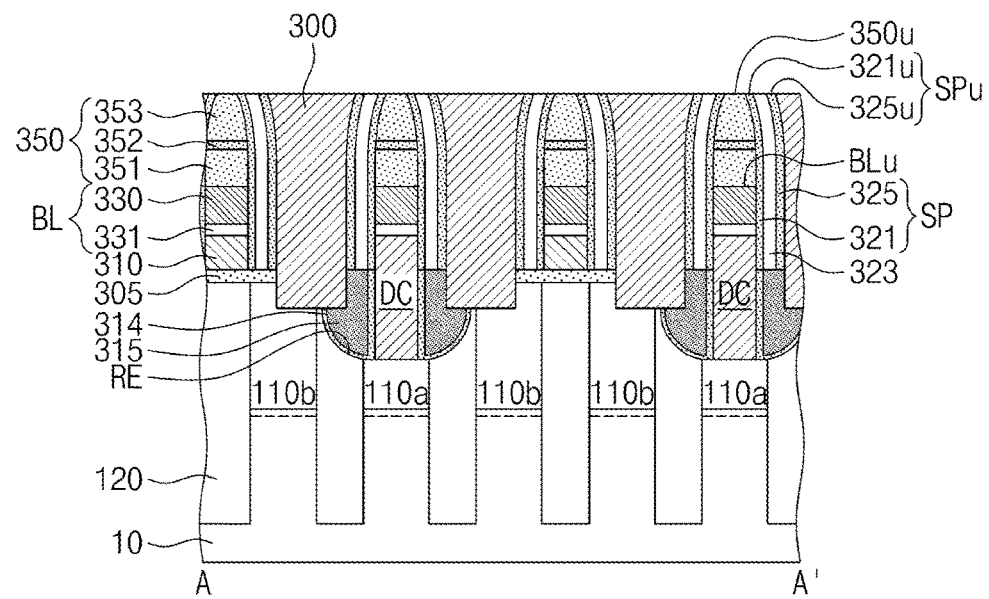
FIGS. 7, 11, 15, 19, and 23 are sectional views taken along lines A-A' of FIGS. 6, 10, 14, 18, and 22, respectively.
Figure 7:
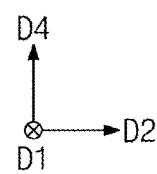
Figure 8:
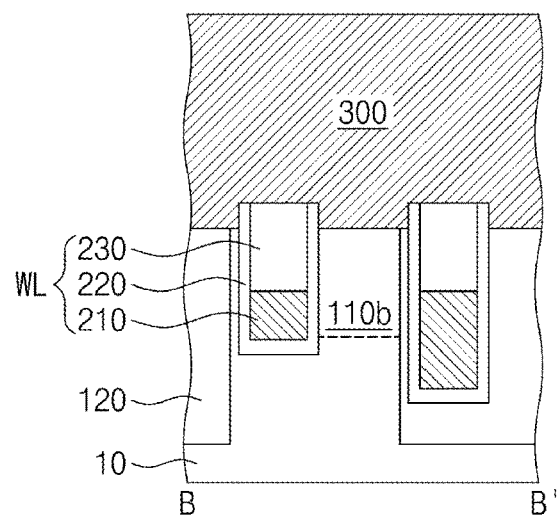
FIGS. 8, 12, 16, 20, and 24 are sectional views taken along lines B-B' of FIGS. 6, 10, 14, 18, and 22, respectively.
Figure 8:
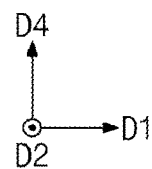
Figure 9:
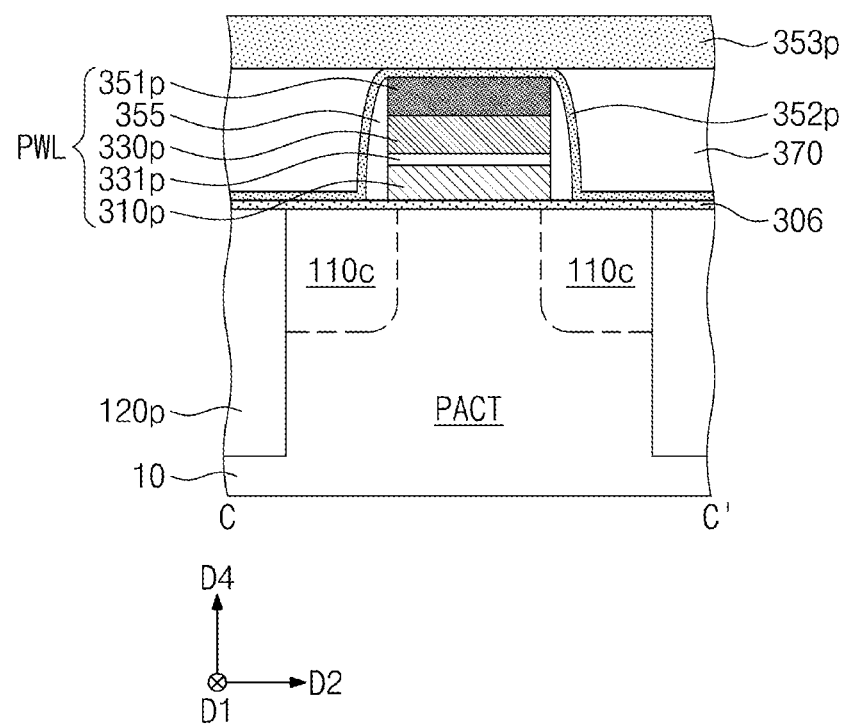
FIGS. 9, 13, 17, 21, and 25 are sectional views taken along lines C-C' of FIGS. 6, 10, 14, 18, and 22, respectively.
Figure 10:
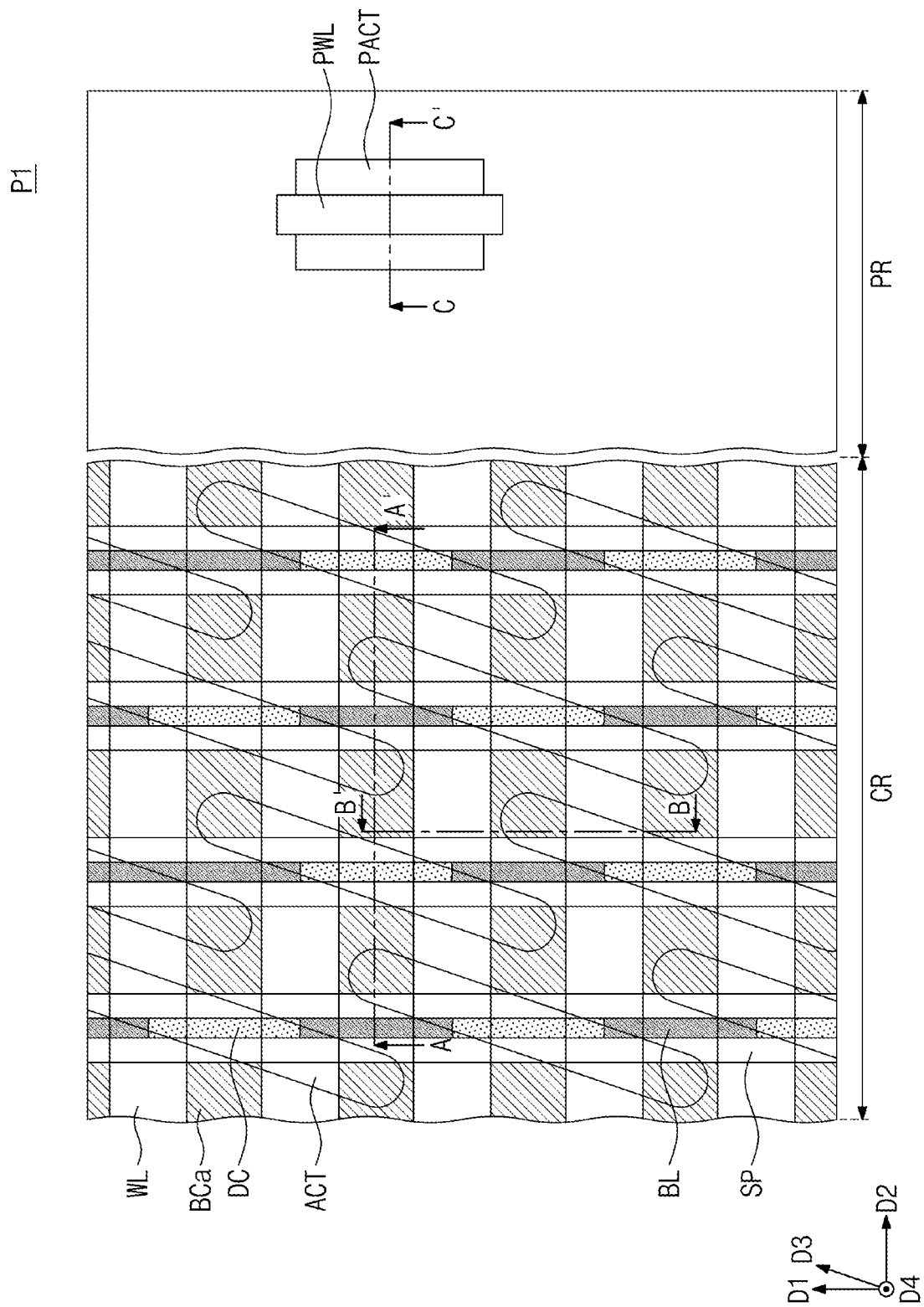
Figure 11:
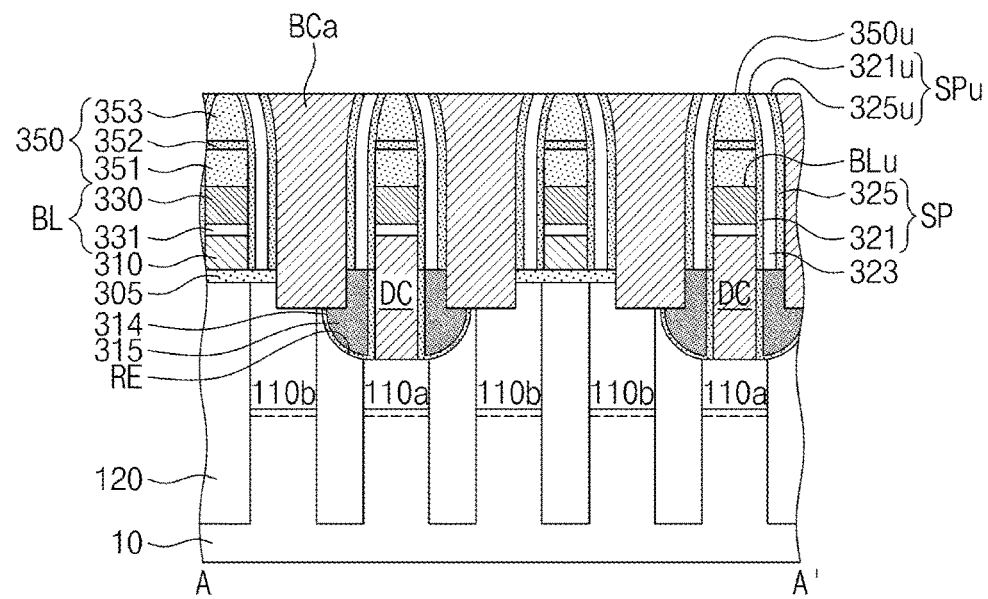
Figure 11:
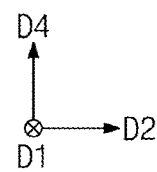
Figure 12:
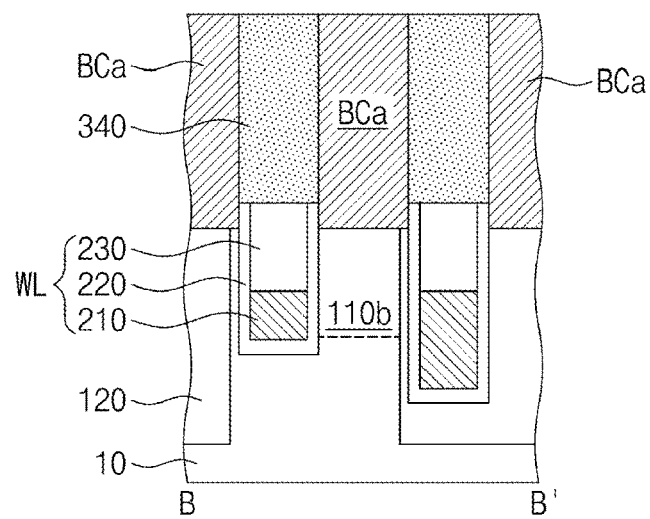
Figure 12:
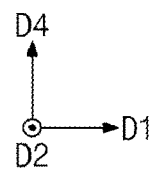
Figure 13:
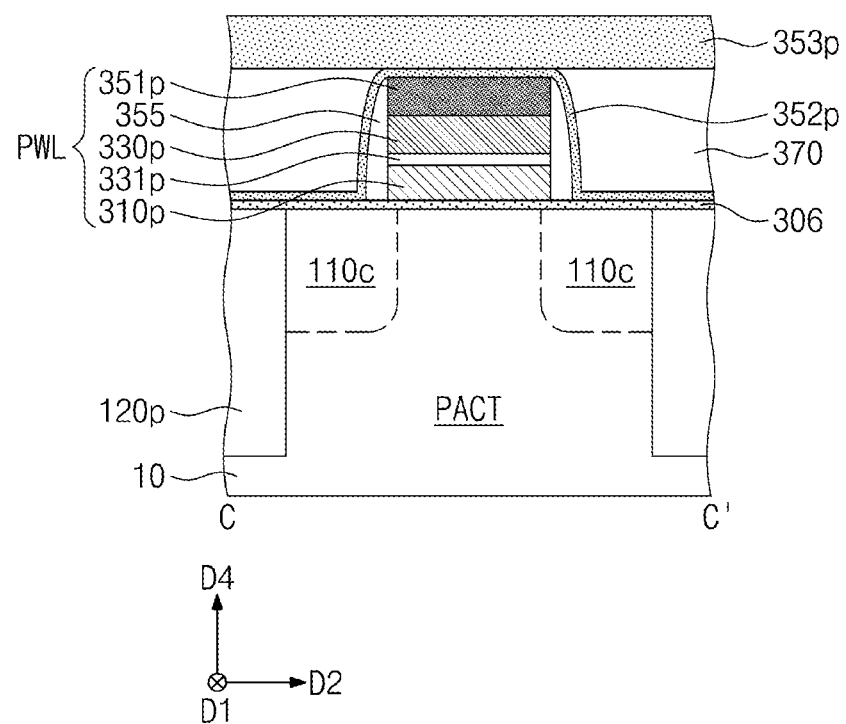
Figure 14:
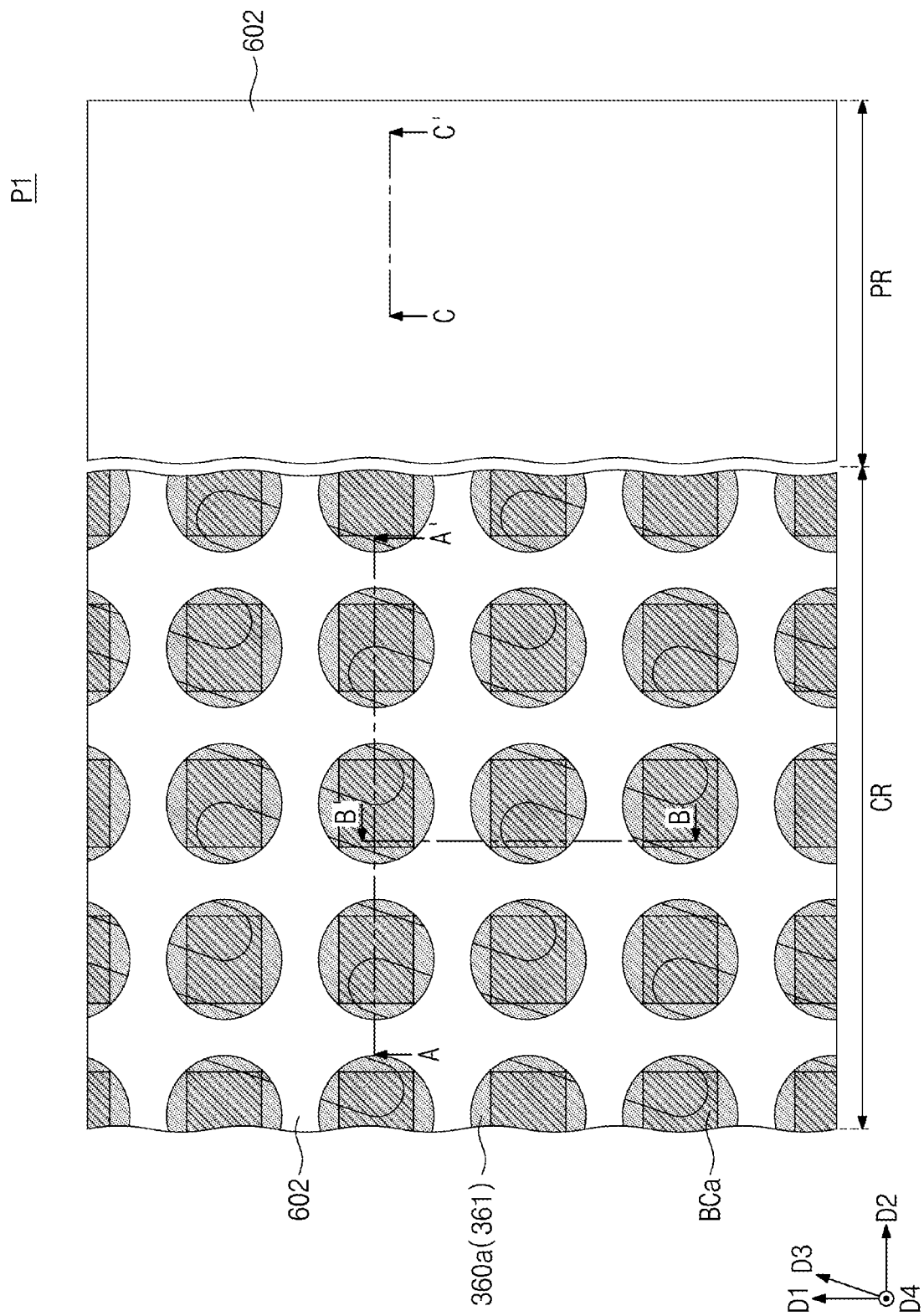
Figure 15:
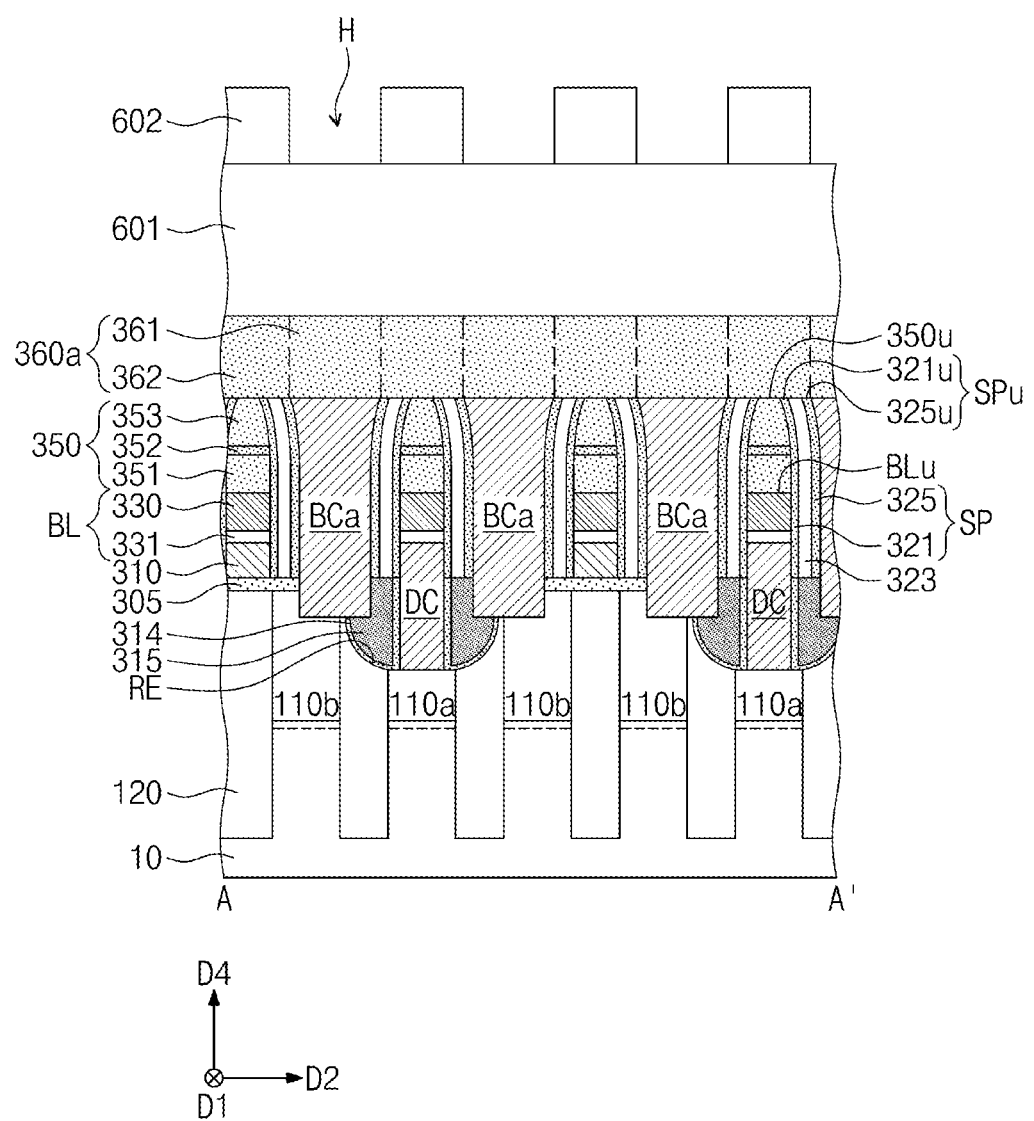
Figure 16:
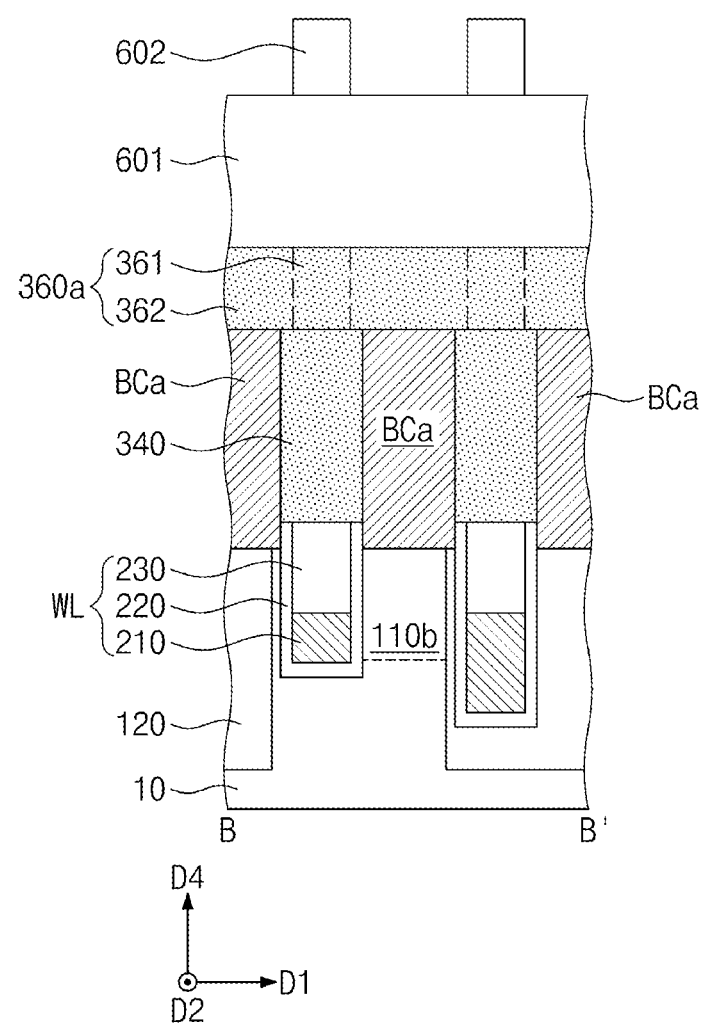
Figure 17:
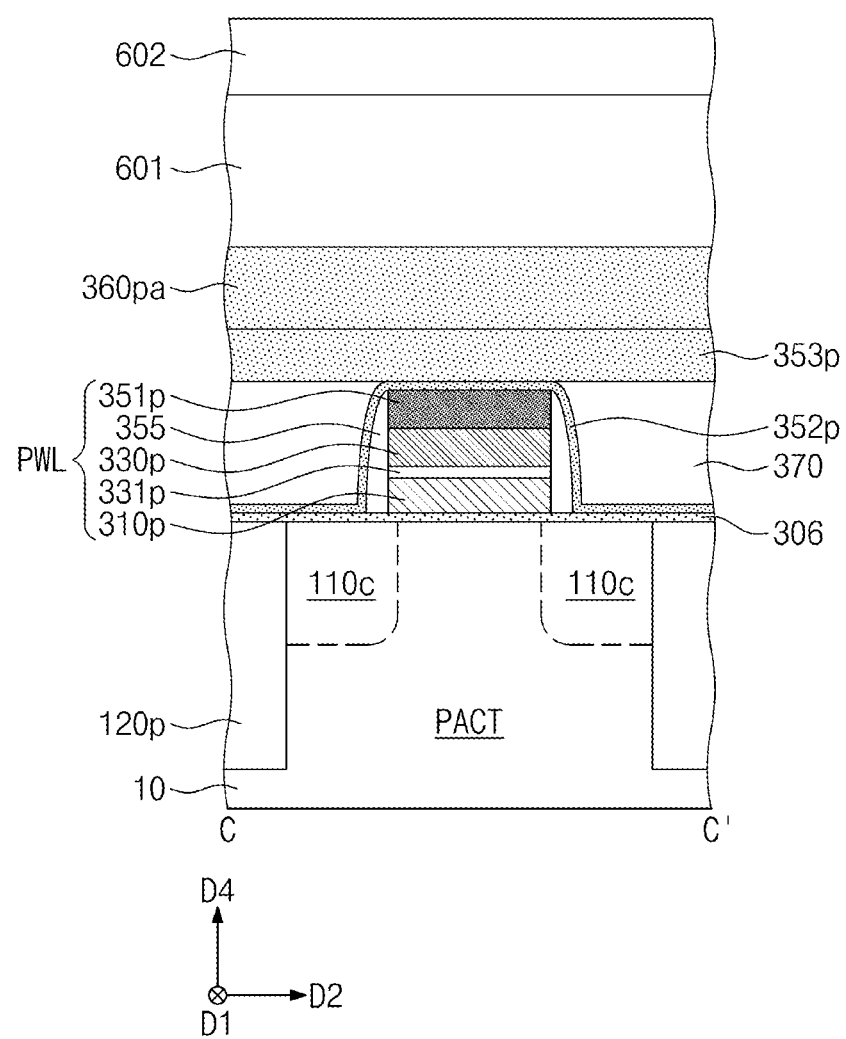
Figure 18:
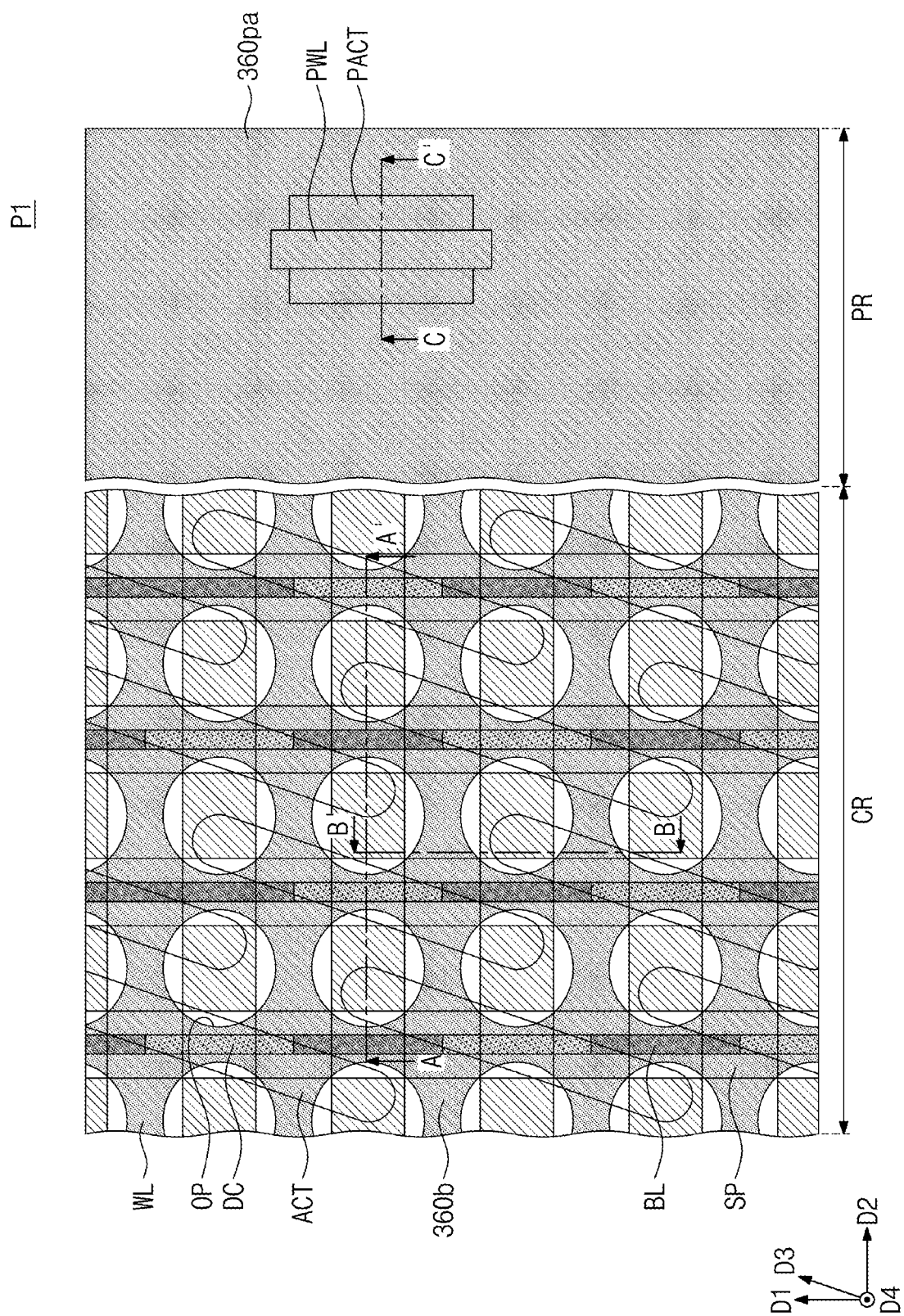
Figure 19:
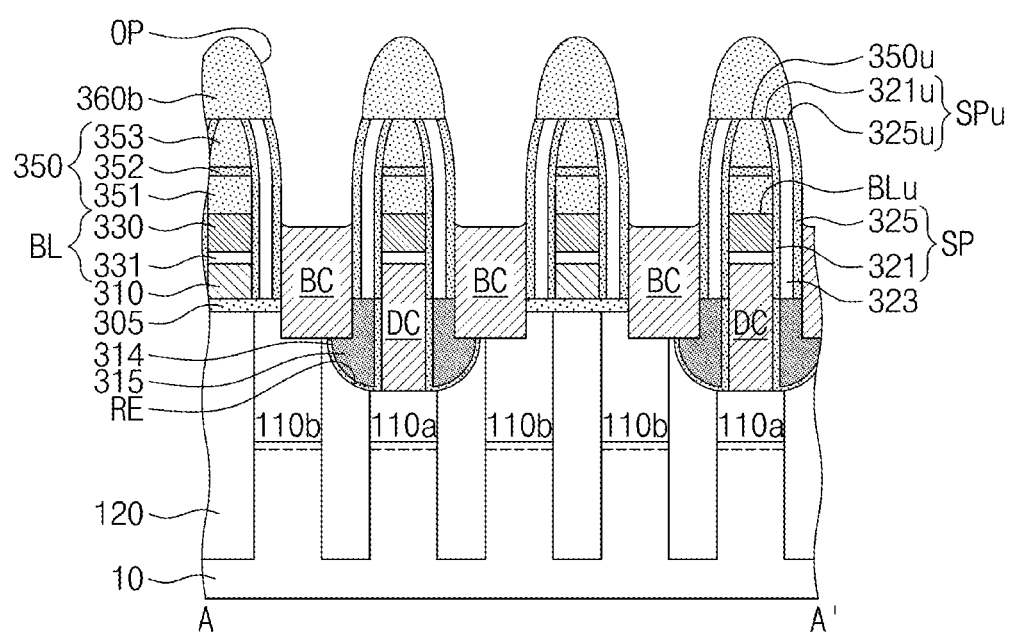
Figure 20:
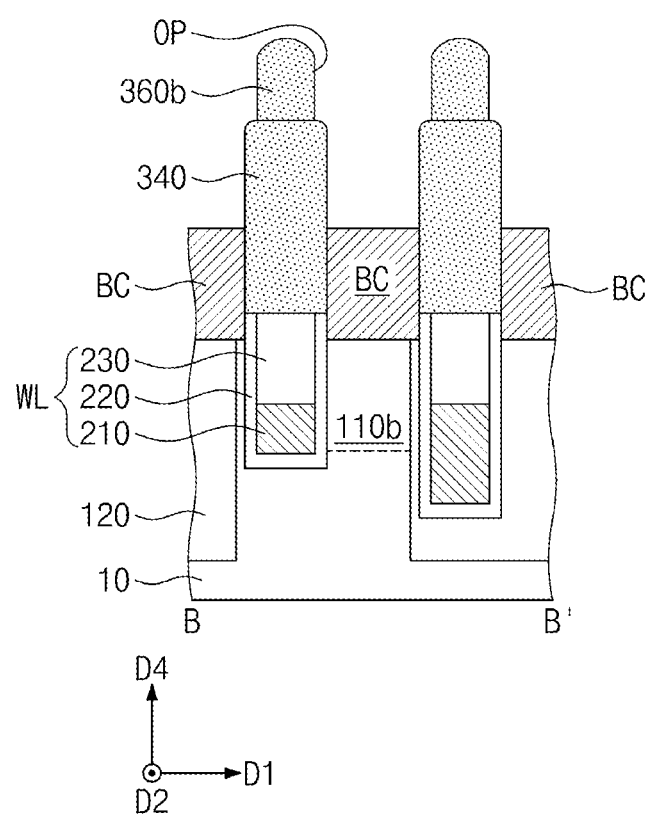
Figure 21:
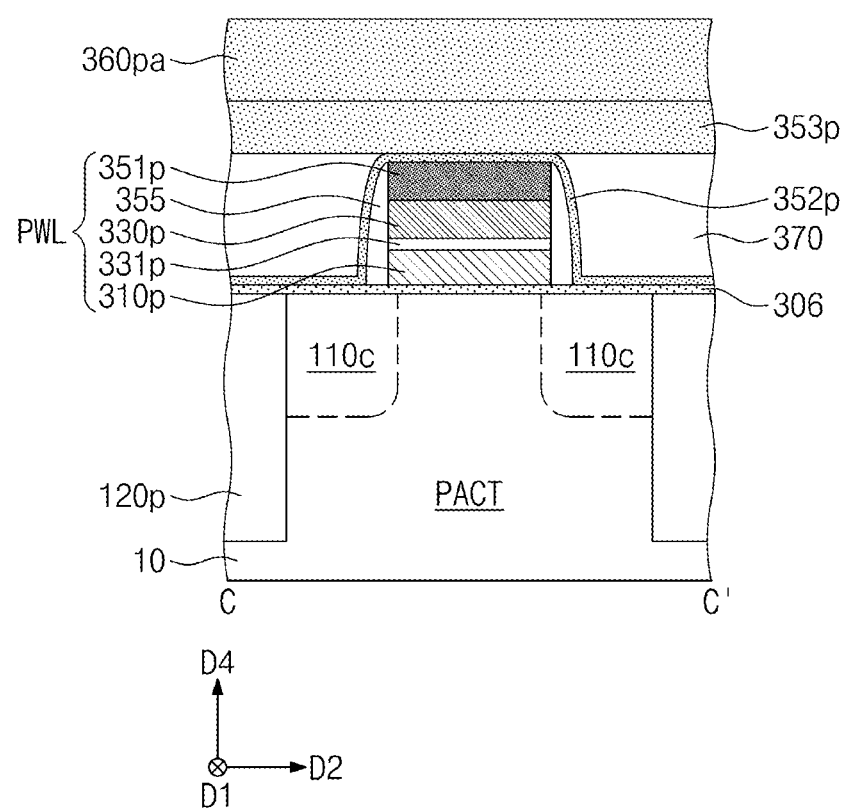
Figure 22:
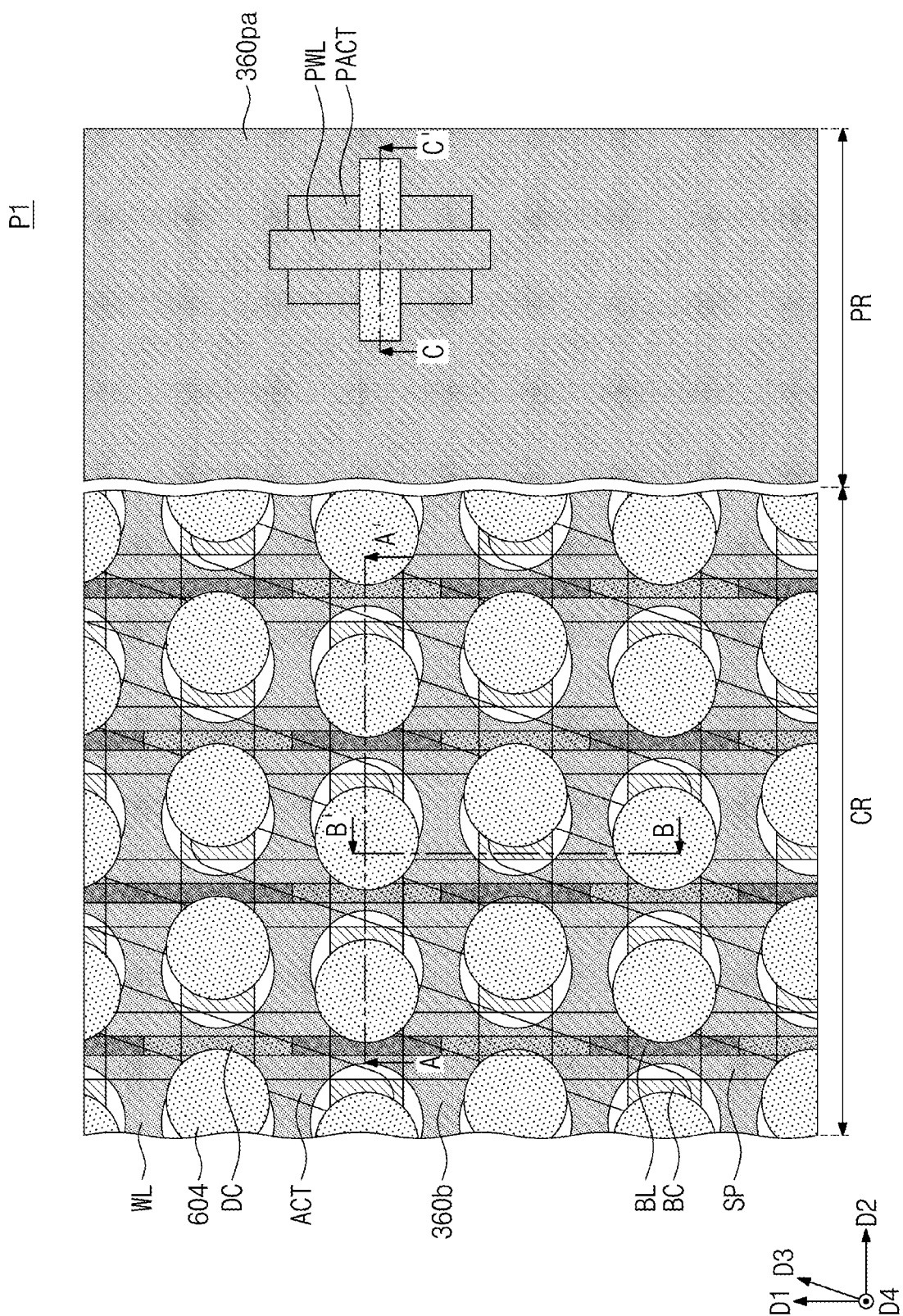
Figure 23:
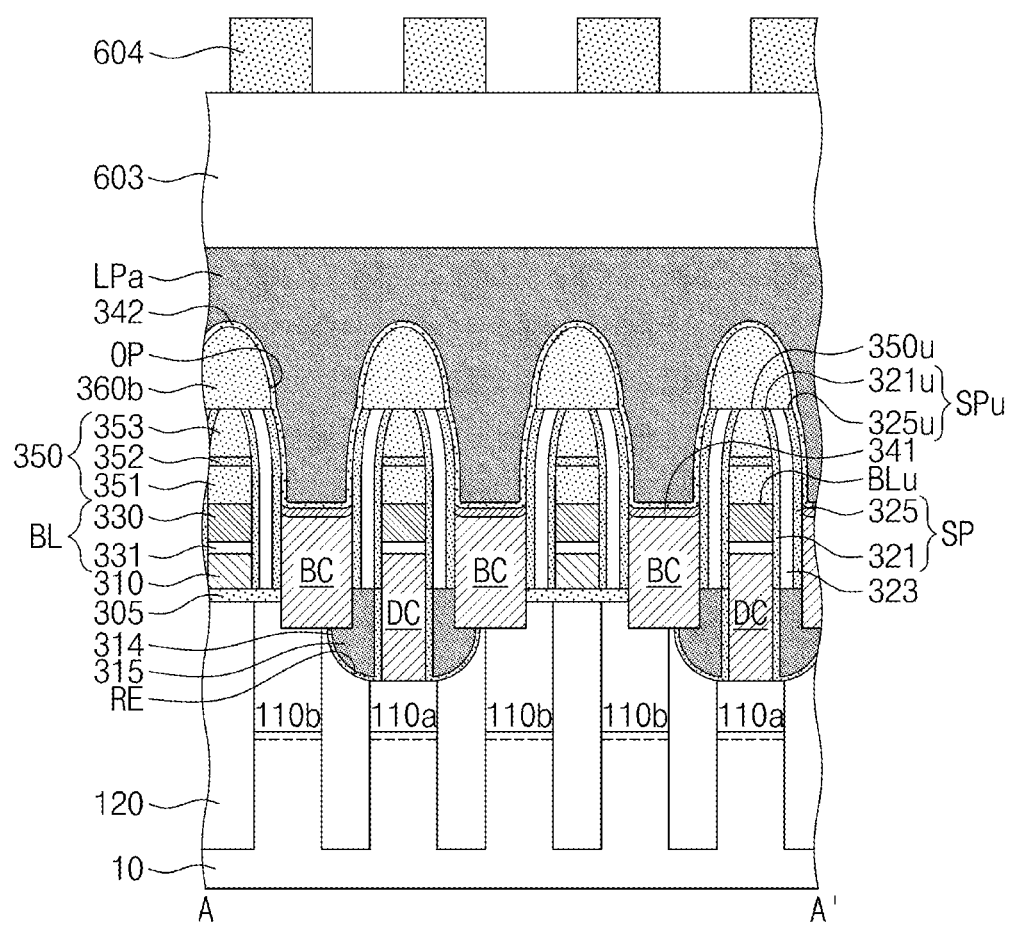
Figure 24:
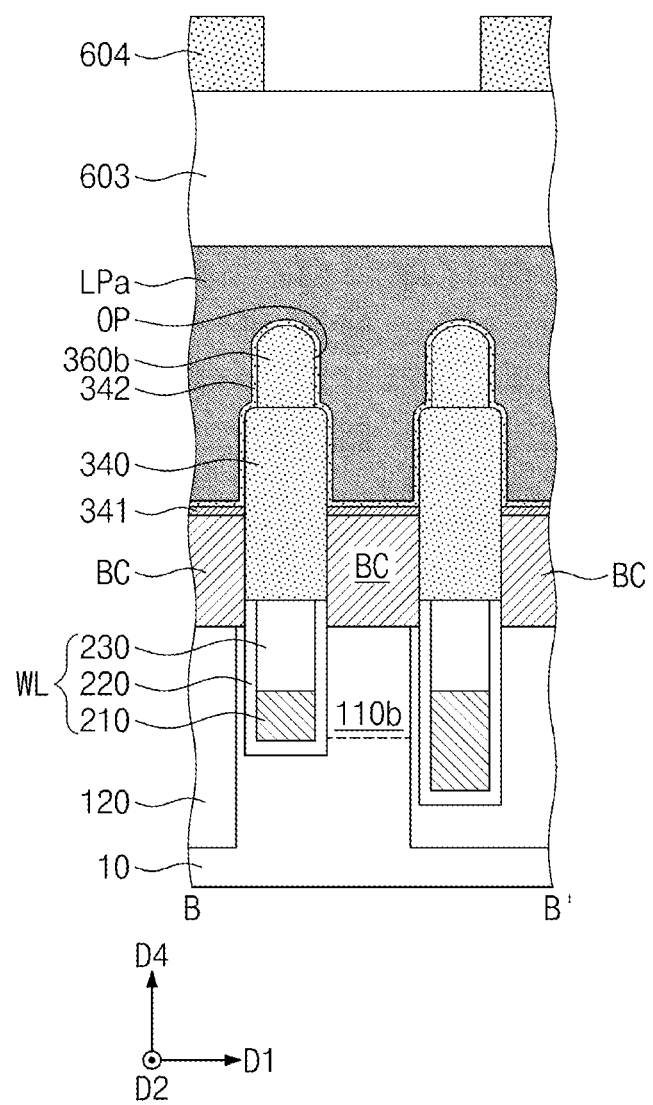
Figure 25:
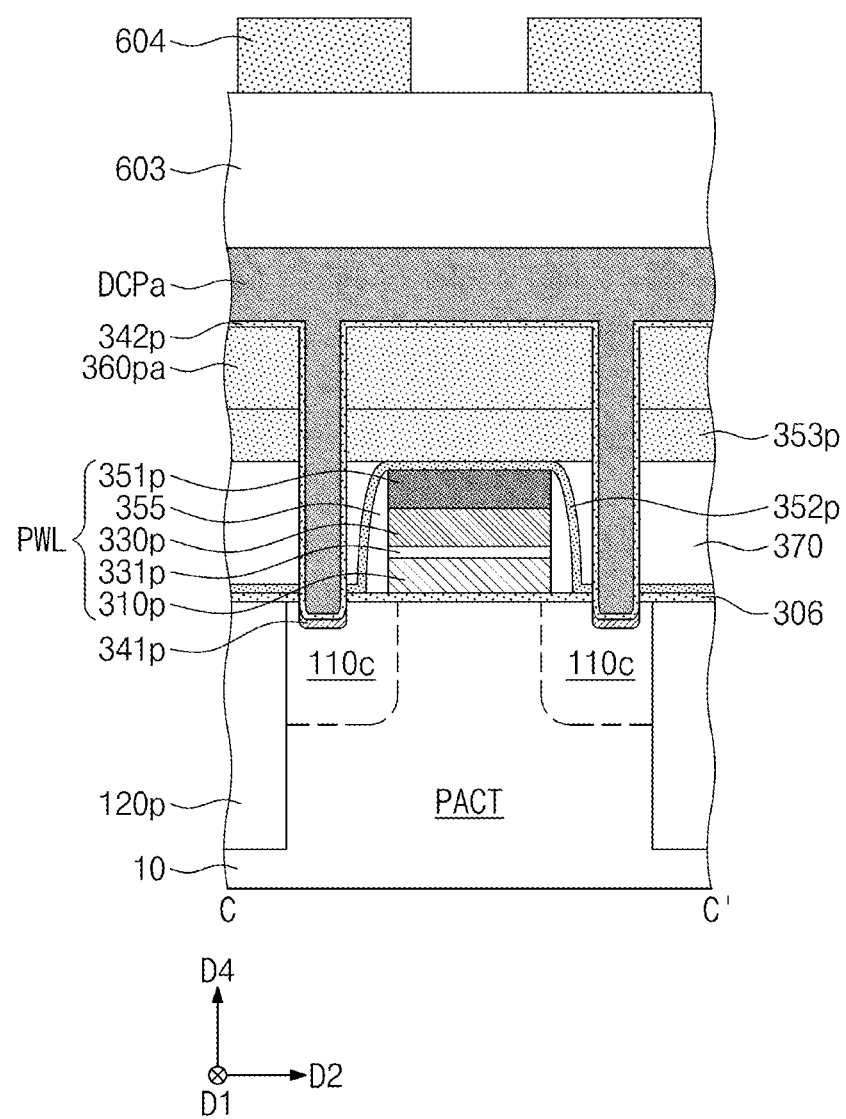

FIG. 2 is a plan view that illustrates a semiconductor device according to an embodiment of the inventive concept and corresponds to a portion 'P1' of FIG. 1. FIGS. 3 to 5 are sectional views which are respectively taken along lines A-A', B-B', and C-C' of FIG. 2.

Referring to FIGS. 2 to 5, a substrate 10 may be provided. The substrate 10 may be a semiconductor substrate (e.g., a silicon substrate, a germanium substrate, or a silicon-germanium substrate). The substrate 10 may include a cell region CR and a peripheral region PR. The cell region CR may be a region of the substrate 10, on which each cell block CB of FIG. 1 is provided, and the peripheral region PR may be another region of the substrate 10, on which the peripheral block PB of FIG. 1 is provided.

Cell active patterns ACT may be disposed on the cell region CR of the substrate 10. The cell active patterns ACT may be spaced apart from each other in a first direction D1 and a second direction D2. The first direction D1 may be parallel to a top surface of the substrate 10, and the second direction D2 may be parallel to the top surface of the substrate 10 and may be non-parallel (e.g., orthogonal) to the first direction D1. The cell active patterns ACT may be bar-shaped patterns extended in a third direction D3, which is parallel to the top surface of the substrate 10 and is not parallel (but rather is oblique) to the first and second directions D1 and D2. An end portion of one of the cell active patterns ACT may be placed adjacent to a center of another of the cell active patterns ACT adjacent thereto in the second direction D2. Each of the cell active patterns ACT may be a protruding portion of the substrate 10 which is extended in a fourth direction D4 perpendicular to the top surface of the substrate 10.

Device isolation layers 120 may be disposed between the cell active patterns ACT on the cell region CR. The device isolation layers 120 may be disposed in the substrate 10 to define the cell active patterns ACT. The device isolation layers 120 may be formed of or include at least one of silicon oxide, silicon nitride, and/or silicon oxynitride.

Word lines WL may be provided on the cell region CR to cross the cell active patterns ACT and the device isolation layers 120. The word lines WL may be disposed in grooves, which are formed in the cell active patterns ACT and the device isolation layers 120. The word lines WL may be extended in the second direction D2 and may be spaced apart from each other in the first direction D1. The word lines WL may be buried in the substrate 10.

Each of the word lines WL may include a cell gate electrode 210, a cell gate dielectric pattern 220, and a cell gate capping pattern 230. The cell gate electrode 210 may be provided to extend into (e.g., penetrate) upper portions of the cell active patterns ACT and the device isolation layers 120.

The cell gate dielectric pattern 220 may be interposed between the cell gate electrode 210 and the cell active patterns ACT and between the cell gate electrode 210 and the device isolation layers 120. The cell gate capping pattern 230 may be provided on the cell gate electrode 210. The cell gate capping pattern 230 may have a top surface that is coplanar with top surfaces of the cell active patterns ACT.

The cell gate electrode 210 may be formed of or include at least one of various conductive materials. In an embodiment, the conductive material may comprise a doped semiconductor material (e.g., doped silicon or doped germanium), a conductive metal nitride (e.g., titanium nitride or tantalum nitride), a metallic material (e.g., tungsten, titanium, or tantalum), and/or a metal-semiconductor compound (e.g., tungsten silicide, cobalt silicide, or titanium silicide). The cell gate dielectric pattern 220 may be formed of or include at least one of silicon oxide, silicon nitride, and/or silicon oxynitride. The cell gate capping pattern 230 may be formed of or include at least one of silicon oxide, silicon nitride, and/or silicon oxynitride.

Impurity regions may be provided in the cell active patterns ACT. The impurity regions may include first impurity regions 110a and second impurity regions 110b. Each of the first impurity regions 110a may be provided between a pair of the word lines WL, which are provided to cross each of the cell active patterns ACT. The second impurity regions 110b may be provided in opposite edge regions of each of the cell active patterns ACT. The first impurity regions 110a and the second impurity regions 110b may contain impurities of the same conductivity type (e.g., n-type).

Peripheral active patterns PACT may be disposed on the peripheral region PR of the substrate 10. Peripheral device isolation layers 120p may be disposed between the peripheral active patterns PACT on the peripheral region PR. The peripheral device isolation layers 120p may be disposed in the substrate 10 to define the peripheral active patterns PACT. Peripheral impurity regions 110c may be provided in the peripheral active patterns PACT.

A buffer pattern 305 may be disposed on the cell region CR of the substrate 10. The buffer pattern 305 may be on (e.g., may cover) the cell active patterns ACT, the device isolation layers 120, and the word lines WL. The buffer pattern 305 may be formed of or include at least one of silicon oxide, silicon nitride, and/or silicon oxynitride.

Bit lines BL may be disposed on the cell region CR. The bit lines BL may be extended in the first direction D1 and may be spaced apart from each other in the second direction D2. Each of the bit lines BL may include a first ohmic pattern 331 and a metal-containing pattern 330, which are sequentially stacked. The first ohmic pattern 331 may be formed of or include at least one of metal silicide materials. The metal-containing pattern 330 may be formed of or include at least one of metallic materials (e.g., tungsten, titanium, tantalum, and so forth).

Polysilicon patterns 310 may be interposed between the bit lines BL and the buffer pattern 305.

Bit line contacts DC may be respectively interposed between the bit lines BL and the first impurity regions 110a. The bit lines BL may be electrically connected to the first impurity regions 110a by the bit line contacts DC. The bit line contacts DC may be formed of or include doped or undoped polysilicon.

The bit line contacts DC may be disposed in recess regions RE. The recess region RE may be provided in upper portions of the first impurity regions 110a and the device isolation layers 120, which are adjacent to each other. A first gapfill insulating pattern 314 and a second gapfill insulating pattern 315 may be provided in (e.g., to fill) a remaining portion of the recess region RE.

A lower capping pattern 350 may be provided on a top surface of each of the bit lines BL. The lower capping pattern 350 may be extended in the first direction D1, on each of the bit lines BL. The lower capping pattern 350 may include a first lower capping pattern 351, a second lower capping pattern 352, and a third lower capping pattern 353. The first lower capping pattern 351, the second lower capping pattern 352, and the third lower capping pattern 353 may be sequentially provided on each of the bit lines BL. The lower capping patterns 350 may be extended in the first direction D1 on each bit line BL and may be spaced apart from each other in the second direction D2. The lower capping pattern 350 may be formed of or include silicon nitride. As an example, the first lower capping pattern 351, the second lower capping pattern 352, and the third lower capping pattern 353 may be formed of or include silicon nitride.

A side surface of each of the polysilicon patterns 310 and a side surface of each of the bit lines BL may be covered with a bit line spacer SP. The bit line spacer SP may be extended to cover (e.g., contact) a side surface of the lower capping pattern 350 and a side surface of an upper portion of each bit line contact DC. A top surface SPu (e.g., the topmost surface) of the bit line spacer SP may be coplanar with a top surface 350u (e.g., the topmost surface) of the lower capping pattern 350. The top surface SPu of the bit line spacer SP may be located at substantially the same level as the top surface 350u of the lower capping pattern 350, when measured from a bottom surface of the substrate 10.

The bit line spacer SP may include a first sub-spacer 321 and a second sub-spacer 325, which are spaced apart from each other. In an embodiment, the first and second sub-spacers 321 and 325 may be spaced apart from each other by an air gap AG. The first sub-spacer 321 may be in contact with the side surface of each of the polysilicon patterns 310 and the side surface of each of the bit lines BL. The second sub-spacer 325 may be provided along a side surface of the first sub-spacer 321. The first and second sub-spacers 321 and 325 may be formed of or include at least one of silicon nitride, silicon oxide, or silicon oxynitride and may have a single- or multi-layered structure. The first and second sub-spacers 321 and 325 may be formed of or include the same material.

Storage node contacts BC may be interposed between adjacent ones of the bit lines BL. The bit line spacer SP may be interposed between the storage node contacts BC and the bit lines BL which are spaced apart from each other. The storage node contacts BC may be spaced apart from each other in the first and second directions D1 and D2. Each of the storage node contacts BC may be electrically connected to a corresponding one of the second impurity regions 110b. The storage node contacts BC may be formed of or include doped or undoped polysilicon.

A fence insulating pattern 340 may be provided between the storage node contacts BC that are adjacent to each other in the first direction D1. The fence insulating patterns 340 may be formed of or include at least one of silicon nitride, silicon oxide, or silicon oxynitride.

An upper capping pattern 360 may be provided on the top surface 350u of the lower capping pattern 350 and a top surface of the fence insulating pattern 340. The upper capping pattern 360 may be on (e.g., may cover and/or contact) at least a portion of the top surface 350u of the lower capping pattern 350 and may be extended to a region, which is located on at least a portion of the top surface SPu of the bit line spacer SP. In an embodiment, the upper capping pattern 360 may be on (e.g., may cover and/or contact) the top surface SPu of the bit line spacer SP. For example, the upper capping pattern 360 may cover and contact at least a portion of a top surface 321u of the first sub-spacer 321 and at least a portion of a top surface 325u of the second sub-spacer 325. The upper capping pattern 360 may be extended to a region, which is located on the air gap AG between the first sub-spacer 321 and the second sub-spacer 325, and at least a portion of a bottom surface 360l of the upper capping pattern 360 may be exposed to the air gap AG.

The top surface SPu of the bit line spacer SP and the top surface 350u of the lower capping pattern 350 may be in contact with the bottom surface 360l of the upper capping pattern 360. In other words, the bit line spacer SP may be extended to the bottom surface 360l of the upper capping pattern 360 along the side surface of the lower capping pattern 350 but may not be extended to a side surface of the upper capping pattern 360. That is, the bit line spacer SP may not be provided on (but rather may be absent from) the side surface of the upper capping pattern 360. In some embodiments, the top surface 350u of the lower capping pattern 350 may be narrower, in the second direction D2, than a bottom surface of the lower capping pattern 350. Moreover, the top surface 350u of the lower capping pattern 350 may be narrower, in the second direction D2, than the bottom surface 360l of the upper capping pattern 360. According to some embodiments, the bottom surface 360l of the upper capping pattern 360 may be wider, in the second direction D2, than the bottom surface of the lower capping pattern 350.

The upper capping pattern 360 may be formed of or include silicon nitride. The upper capping pattern 360 may be formed of a single material. For example, the upper capping pattern 360 may be formed of silicon nitride.

In an embodiment, the upper capping pattern 360 may include a plurality of upper capping patterns 360. The upper capping patterns 360 may be spaced apart from each other in the first and second directions D1 and D2. A distance between ones of the upper capping patterns 360, which are adjacent to each other in the second direction D2, may be larger than a distance between adjacent ones of the bit line spacer SP.

When viewed in a plan view, the upper capping patterns 360 may be arranged in a zigzag shape and may be spaced apart from each other in the first direction D1. For example, a pair of the upper capping patterns 360, which are most adjacent to each other in the first direction D1, may be shifted from each other in the second direction D2. The adjacent pair of the upper capping patterns 360 may have a symmetrical shape with respect to an axis parallel to the first direction D1.

Second ohmic patterns 341 may be disposed on the storage node contacts BC, respectively. The second ohmic patterns 341 may be formed of or include at least one of metal silicide materials.

A diffusion prevention pattern 342 may conformally cover the second ohmic pattern 341, the bit line spacer SP, the upper capping pattern 360, and the fence insulating pattern 340. The diffusion prevention pattern 342 may be formed of or include at least one of various metal nitride materials (e.g., titanium nitride and tantalum nitride). Each of the second ohmic patterns 341 may be interposed between the diffusion prevention pattern 342 and a corresponding one of the storage node contacts BC.

Landing pads LP may be disposed on the storage node contacts BC, respectively. The landing pads LP may be formed of or include a metal-containing material (e.g., tungsten). Upper portions of the landing pads LP may be shifted/offset from the storage node contacts BC in the second direction D2. The landing pads LP may be spaced apart from each other in the first and second directions D1 and D2. The diffusion prevention pattern 342 may be interposed between the landing pads LP and the upper capping patterns 360, between the landing pads LP and the lower capping patterns 350, and between the landing pads LP and the storage node contacts BC.

A first interlayer insulating pattern 400 may be provided to enclose each of the landing pads LP. A side surface of the first interlayer insulating pattern 400 may be in contact with a side portion of the upper capping pattern 360, an upper side portion of the lower capping pattern 350, an upper portion of the bit line spacer SP, and an upper side portion of the fence insulating pattern 340. When measured from the bottom surface of the substrate 10, a bottom surface 400l of the first interlayer insulating pattern 400 may be located at a level that is higher (i.e., farther from the bottom surface of the substrate 10) than top surfaces BLu of the bit lines BL and is lower than the bottom surfaces 360l of the upper capping patterns 360. The first interlayer insulating pattern 400 may be formed of or include at least one of silicon oxide, silicon nitride, and/or silicon oxynitride. Alternatively, the first interlayer insulating pattern 400 may further include a space, which is connected to the air gap AG and is filled with the air.

Bottom electrodes BE may be disposed on the landing pads LP, respectively. The bottom electrodes BE may be formed of or include at least one of doped poly-silicon, metal nitride materials (e.g., titanium nitride), or metallic materials (e.g., tungsten, aluminum, and copper). Each of the bottom electrodes BE may have a circular pillar shape, a hollow cylinder shape, or a cup shape. An upper supporting pattern SS1 may be provided to support upper side surfaces of the bottom electrodes BE, and a lower supporting pattern SS2 may be provided to support lower side surfaces of the bottom electrodes BE. The upper and lower supporting patterns SS1 and SS2 may be formed of or include at least one of insulating materials (e.g., silicon nitride, silicon oxide, and silicon oxynitride).

An etch stop layer 420 may be provided between adjacent ones of the bottom electrodes BE and on the first interlayer insulating pattern 400. The etch stop layer 420 may be formed of or include at least one of various insulating materials (e.g., silicon nitride, silicon oxide, and silicon oxynitride). A dielectric layer DL may be provided on (e.g., to cover) surfaces of the bottom electrodes BE and surfaces of the upper and lower supporting patterns SS1 and SS2. The dielectric layer DL may include at least one of a silicon oxide layer, a silicon nitride layer, a silicon oxynitride layer, or a high-k dielectric layer (e.g., a hafnium oxide layer). A top electrode TE may be disposed on the dielectric layer DL in (e.g., to fill) a space between the bottom electrodes BE. The top electrode TE may include at least one of a doped poly-silicon layer, a doped silicon germanium layer, a metal nitride layer (e.g., a titanium nitride layer), or a metal layer (e.g., tungsten, aluminum, and copper layers). The bottom electrodes BE, the dielectric layer DL, and the top electrode TE may constitute a capacitor CA.

A peripheral gate dielectric pattern 306 and peripheral word lines PWL may be provided on the peripheral region PR of the substrate 10. The substrate 10, the peripheral gate dielectric pattern 306, and the peripheral word lines PWL may be provided in a sequentially-stacked form.

The peripheral word lines PWL may be provided to cross the peripheral active patterns PACT. Each of the peripheral word lines PWL may include a peripheral polysilicon pattern 310p, a first peripheral ohmic pattern 331p, a peripheral metal-containing pattern 330p, a first peripheral capping pattern 351p, and a peripheral spacer 355. The peripheral polysilicon pattern 310p, the first peripheral ohmic pattern 331p, the peripheral metal-containing pattern 330p, and the first peripheral capping pattern 351p may be provided in a sequentially-stacked form. The peripheral polysilicon pattern 310p, the first peripheral ohmic pattern 331p, the peripheral metal-containing pattern 330p, and the first peripheral capping pattern 351p may be formed of or include the same materials as the polysilicon pattern 310, the first ohmic pattern 331, the metal-containing pattern 330, and the first lower capping pattern 351, respectively, and may be provided to cross the peripheral active pattern PACT. In an embodiment, the first lower capping pattern 351 and the first peripheral capping pattern 351p may be formed of or include silicon nitride. The peripheral spacer 355 may be provided on a side surface of the peripheral polysilicon pattern 310p, a side surface of the first peripheral ohmic pattern 331p, a side surface of the peripheral metal-containing pattern 330p, and a side surface of the first peripheral capping pattern 351p.

A lower peripheral insulating pattern 370 may be provided on a side surface of the peripheral word line PWL. The lower peripheral insulating pattern 370 may be provided to enclose the side surfaces of the peripheral word lines PWL. The lower peripheral insulating pattern 370 may be formed of or include silicon oxide.

A second peripheral capping pattern 352p may be on (e.g., may cover) a top surface of the peripheral word line PWL and may be extended along a side surface of the peripheral spacer 355 and a top surface of the peripheral gate dielectric pattern 306. The second peripheral capping pattern 352p may be interposed between the side surface of the peripheral word line PWL and the lower peripheral insulating pattern 370 and between the substrate 10 and the lower peripheral insulating pattern 370. A top surface of the second peripheral capping pattern 352p, which covers the top surfaces of the peripheral word lines PWL, may be coplanar with a top surface of the lower peripheral insulating pattern 370.

The second peripheral capping pattern 352p may be formed of or include the same material as the second lower capping pattern 352. As an example, the second lower capping pattern 352 and the second peripheral capping pattern 352p may be formed of or include silicon nitride.

A third peripheral capping pattern 353p may be provided on the lower peripheral insulating pattern 370 and the peripheral word lines PWL. The third peripheral capping pattern 353p may cover the lower peripheral insulating pattern 370. The third peripheral capping pattern 353p may cover the second peripheral capping pattern 352p, on the peripheral word lines PWL. The third peripheral capping pattern 353p may be formed of or include the same material as the third lower capping pattern 353. In an embodiment, the third lower capping pattern 353 and the third peripheral capping pattern 353p may be formed of or include silicon nitride.

Fourth peripheral capping patterns 360p may be provided on the third peripheral capping pattern 353p. The fourth peripheral capping patterns 360p may cover at least a portion of the third peripheral capping pattern 353p. Portions of the fourth peripheral capping patterns 360p may be disposed on the peripheral word lines PWL. The first peripheral capping pattern 351p, the second peripheral capping pattern 352p, the third peripheral capping pattern 353p, and the portions of the fourth peripheral capping patterns 360p may be provided in a sequentially-stacked form. The fourth peripheral capping patterns 360p may be formed of or include the same material as the upper capping pattern 360. In an embodiment, the upper capping pattern 360 and the fourth peripheral capping patterns 360p may be formed of or include silicon nitride.

An upper peripheral insulating pattern 400p may be interposed between the fourth peripheral capping patterns 360p. The upper peripheral insulating pattern 400p may enclose each of the fourth peripheral capping patterns 360p. The upper peripheral insulating pattern 400p may be in (e.g., may fill) a recess that is provided in an upper portion of the third peripheral capping pattern 353p. When measured from the bottom surface of the substrate 10, a bottom surface 400p1 of the upper peripheral insulating pattern 400p may be located at a level that is lower (i.e., closer to the bottom surface of the substrate 10) than bottom surfaces 360p1 of the fourth peripheral capping patterns 360p and is higher than bottom surfaces of the third peripheral capping pattern 353p.

Peripheral contact plugs DCP may be respectively disposed at opposite sides of each of the peripheral word lines PWL. Each of the peripheral contact plugs DCP may be provided to sequentially extend into (e.g., penetrate) the upper peripheral insulating pattern 400p, the fourth peripheral capping pattern 360p, the third peripheral capping pattern 353p, the lower peripheral insulating pattern 370, and an upper portion of the substrate 10. In an embodiment, the peripheral impurity regions 110c may be provided in the upper portion of the substrate 10. A second peripheral ohmic pattern 341p may be interposed between the peripheral contact plug DCP and the upper portion of the substrate 10. An upper portion of the peripheral contact plug DCP may be enclosed by the peripheral insulating pattern 400p. A peripheral diffusion prevention pattern 342p may be provided to enclose at least a portion of the peripheral contact plugs DCP. The peripheral contact plugs DCP may be formed of or include the same material as the landing pads LP. As an example, the peripheral contact plugs DCP may be formed of or include a metal-containing material (e.g., tungsten).

A second interlayer insulating pattern 500 may be provided on the peripheral region PR. The second interlayer insulating pattern 500 may be provided on the upper peripheral insulating pattern 400p and the peripheral contact plugs DCP. The second interlayer insulating pattern 500 may be formed of or include at least one of silicon oxide, silicon nitride, and/or silicon oxynitride.

FIGS. 6, 10, 14, 18, and 22 are plan views which illustrate a method of fabricating a semiconductor device according to an embodiment of the inventive concept and correspond to a portion 'P1' of FIG. 1. FIGS. 7, 11, 15, 19, and 23 are sectional views taken along lines A-A' of FIGS. 6, 10, 14, 18, and 22, respectively. FIGS. 8, 12, 16, 20, and 24 are sectional views taken along lines B-B' of FIGS. 6, 10, 14, 18, and 22, respectively. FIGS. 9, 13, 17, 21, and 25 are sectional views taken along lines C-C' of FIGS. 6, 10, 14, 18, and 22, respectively. A method of fabricating a semiconductor device according to an embodiment of the inventive concept will be described in more detail below. For concise description, an element previously described with reference to FIGS. 1 to 5 may be identified by the same reference number without repeating an overlapping description thereof.

Referring to FIGS. 6 to 9, the substrate 10 including the cell region CR and the peripheral region PR may be provided.

On the cell region CR, the cell active patterns ACT and the device isolation layers 120 may be formed in the substrate 10. The cell active patterns ACT may be spaced apart from each other in the first direction D1, which is parallel to the top surface of the substrate 10, and in the second direction D2, which is parallel to the top surface of the substrate 10 and is non-parallel (e.g., orthogonal) to the first direction D1. The cell active patterns ACT may be bar-shaped patterns extended in the third direction D3, which is parallel to the top surface of the substrate 10 and is not parallel to the first and second directions D1 and D2. The device isolation layers 120 may be disposed in the substrate 10 to define the cell active patterns ACT.

The word lines WL may be formed on the cell region CR to cross the cell active patterns ACT and the device isolation layers 120. The word lines WL may be extended in the second direction D2 and may be spaced apart from each other in the first direction D1. The word lines WL may be buried in the substrate 10.

Impurity regions may be formed in the cell active patterns ACT and may include the first impurity regions 110a and the second impurity regions 110b. The first impurity regions 110a may be formed between a pair of the word lines WL which are formed to cross each of the cell active patterns ACT. The second impurity regions 110b may be formed in opposite edge regions of each of the cell active patterns ACT.

The buffer pattern 305, the bit line contacts DC, the polysilicon patterns 310, the bit lines BL, and the lower capping patterns 350 may be formed on the cell region CR.

In detail, a buffer layer and a first poly-silicon layer may be stacked on the substrate 10, and the recess region RE may be formed in upper portions of the first impurity regions 110a and upper portions of the device isolation layers 120 adjacent thereto. The recess region RE may be formed by etching the buffer layer, the first poly-silicon layer, upper portions of the first impurity regions 110a, and upper portions of the device isolation layers 120 adjacent thereto, and here, the buffer pattern 305 may be a portion of the buffer layer, which is left after the etching process. Thereafter, preliminary bit line contacts may be formed in (e.g., to fill) the recess region RE, and then, a bit line layer and a lower capping layer may be sequentially formed. The bit line contacts DC, the polysilicon patterns 310, the bit lines BL, and the lower capping patterns 350 may be formed by etching the preliminary bit line contacts, the first poly-silicon layer, the bit line layer, and the lower capping layer, respectively. The bit line layer may include an ohmic layer and a metal-containing layer. The lower capping layer may include a first lower capping layer, a second lower capping layer, and a third lower capping layer.

The bit lines BL may be formed to extend in the first direction D1 and to be adjacent to each other in the second direction D2. Each of the bit lines BL may include the first ohmic pattern 331 and the metal-containing pattern 330, which are sequentially stacked.

The lower capping patterns 350 may be formed to extend in the first direction D1 and to be adjacent to each other in the second direction D2. Each of the lower capping patterns 350 may include the first lower capping pattern 351, the second lower capping pattern 352, and the third lower capping pattern 353, which are sequentially stacked.

The bit line spacers SP may be formed on (e.g., to cover) the side surfaces of the bit lines BL and the lower capping patterns 350. In an embodiment, during this process, the first gapfill insulating pattern 314 and the second gapfill insulating pattern 315 may be formed in (e.g., to fill) a remaining portion of the recess region RE. Each of the bit line spacers SP may include the first and second sub-spacers 321 and 325, which are spaced apart from each other. As an example, the first and second sub-spacers 321 and 325 may be formed to be spaced apart from each other by the air gap AG.

Line patterns 300 may be formed between adjacent ones of the bit line spacers SP. The formation of the line patterns 300 may include forming a second poly-silicon layer in (e.g., to fill) a space between the adjacent ones of the bit line spacers SP and on (e.g., to cover) the bit line spacers SP and removing an upper portion of the second poly-silicon layer to form the line patterns 300, which are remaining portions of the second poly-silicon layer that are separated from each other by the bit line spacers SP.

Upper portions of the bit line spacers SP and upper portions of the lower capping patterns 350 may also be removed during the process of removing the upper portion of the second poly-silicon layer. In an embodiment, this process may include performing a polishing process to planarize the upper portions of the bit line spacers SP and the upper portions of the lower capping patterns 350. As a result of this process, the top surfaces 350u of the lower capping patterns 350 may be exposed to the outside. The top surface 350u (e.g., the topmost surface) of the lower capping patterns 350 may be coplanar with the top surface SPu (e.g., the topmost surface) of the bit line spacers SP. The top surface SPu of the bit line spacer SP may be located at substantially the same level as the top surface 350u of the lower capping pattern 350, when measured from the bottom surface of the substrate 10.

The peripheral device isolation layers 120p may be formed in the peripheral region PR of the substrate 10 to define the peripheral active patterns PACT. The peripheral impurity regions 110c may be formed in the peripheral active patterns PACT. The peripheral gate dielectric pattern 306 may be formed on the peripheral active patterns PACT and the peripheral device isolation layers 120p.

The peripheral word lines PWL may be formed on the peripheral active patterns PACT. Each of the peripheral word lines PWL may include the peripheral polysilicon pattern 310p, the first peripheral ohmic pattern 331p, the peripheral metal-containing pattern 330p, and the first peripheral capping pattern 351p, which are sequentially stacked. Each of the peripheral word lines PWL may further include the peripheral spacer 355. The peripheral polysilicon pattern 310p, the first peripheral ohmic pattern 331p, the peripheral metal-containing pattern 330p, and the first peripheral capping pattern 351p may be formed by etching the first poly-silicon layer, the ohmic layer, the metal-containing layer, and the first lower capping layer, respectively.

The second peripheral capping pattern 352p may be formed on (e.g., to cover) the peripheral word lines PWL and to extend along the side surface of the peripheral spacer 355 and the top surface of the peripheral gate dielectric pattern 306. The second peripheral capping pattern 352p may be formed by etching the second lower capping layer.

The lower peripheral insulating pattern 370 may be formed to enclose the second peripheral capping pattern 352p. The lower peripheral insulating pattern 370 may be formed of or include silicon oxide.

The third peripheral capping pattern 353p may be formed on the lower peripheral insulating pattern 370 and the peripheral word lines PWL. The third peripheral capping pattern 353p may be formed to cover a portion of the second peripheral capping pattern 352p that is located on the peripheral word line PWL. The third peripheral capping pattern 353p may be formed by etching the third lower capping layer.

Referring to FIGS. 10 to 13, preliminary storage node contacts BCa may be formed by etching the line patterns 300. In detail, since the line patterns 300 are etched using etch masks, which are extended in the second direction D2 and are spaced apart from each other in the first direction D1, the line patterns 300 may be divided into the preliminary storage node contacts BCa. That is, the preliminary storage node contacts BCa may be formed to be spaced apart from each other in the first and second directions D1 and D2. A portion of each line pattern 300, which is located on the word line WL, may be removed by the etching process.

The fence insulating pattern 340 may be formed in an empty region, which is formed by removing the portion of the line pattern 300. The fence insulating pattern 340 may be formed to separate the storage node contacts BC, which are adjacent to each other in the first direction D1, from each other.

The preliminary storage node contacts BCa may have top surfaces that are coplanar with those of the lower capping patterns 350, the bit line spacers SP, and the fence insulating pattern 340.

Referring to FIGS. 14 to 17, an upper capping layer 360a may be formed on the cell region CR on (e.g., to cover) the top surfaces of the bit line spacers SP and the top surfaces of the preliminary storage node contacts BCa. The upper capping layer 360a may include first portions 361, which overlap the preliminary storage node contacts BCa, and a second portion 362, which is provided between the first portions 361.

A fourth peripheral capping layer 360pa may be formed on the peripheral region to cover the third peripheral capping pattern 353p. The fourth peripheral capping layer 360pa and the upper capping layer 360a may be formed through the same process and may be formed of or include the same material.

A first mask layer 601 and a second mask pattern 602 may be sequentially stacked on the upper capping layer 360a and the fourth peripheral capping layer 360pa. On the cell region CR, the second mask pattern 602 may have a plurality of holes H, which are spaced apart from each other in the first and second directions D1 and D2. The second mask pattern 602 may vertically overlap the second portion 362 of the upper capping layer 360a. The plurality of the holes H may vertically overlap the first portion 361 of the upper capping layer 360a. In an embodiment, the holes H may have a circular shape. The second mask pattern 602 may be formed to cover the entire region of the peripheral region PR.

The formation of the second mask pattern 602 may include performing a lithography process using extreme ultraviolet (EUV) light. In the present specification, the EUV light may have a wavelength of 4 nanometers (nm) to 124 nm and, in particular, of 4 nm to 20 nm and may be, for example, an ultraviolet light having a wavelength of 13.5 nm. The EUV light may have an energy of 6.21 eV to 124 eV (in particular, 90 eV to 95 eV).

The EUV lithography process may include a step of exposing a second mask layer to the EUV light and a step of developing the exposed second mask layer. The second mask layer may be formed to have a relatively thin thickness on the first mask layer 601. The second mask pattern 602 may be formed by developing the second mask layer exposed to the EUV light.

As an example, the second mask layer may be an organic photoresist layer containing an organic polymer, such as polyhydroxystyrene. The second mask layer, which is the organic photoresist layer, may further include a photosensitive compound that can react with the EUV light. The second mask layer may further contain a material having high EUV absorptivity (e.g., organometallic materials, iodine-containing materials, or fluorine-containing materials). As another example, the second mask layer may be an inorganic photoresist layer containing an inorganic material, such as tin oxide.

When viewed in a plan view, the second mask patterns 602 may have holes that have a rectangular shape, a honeycomb shape, or a circular shape, but the inventive concept is not limited to these examples. In an embodiment, the second mask patterns 602 may have a plurality of holes H having a circular shape.

Referring to FIGS. 18 to 21, a preliminary upper capping pattern 360b may be formed by etching the upper capping layer 360a. At least a portion of the second portion 362 of the upper capping layer 360a may constitute the preliminary upper capping pattern 360b. The preliminary upper capping pattern 360b may remain (i.e., be present) on the lower capping patterns 350 after etching the upper capping layer 360a (and after etching the preliminary storage node contacts BCa).

The formation of the preliminary upper capping pattern 360b may include forming openings OP exposing the preliminary storage node contacts BCa, respectively. The preliminary upper capping pattern 360b may have the openings OP therein. The formation of the openings OP may include etching the first mask layer 601 using the second mask pattern 602 as an etch mask to form a first mask pattern and etching the first portions 361 of the upper capping layer 360a using the first mask pattern as an etch mask. Accordingly, the openings OP of the preliminary upper capping pattern 360b may have a rectangular shape, a honeycomb shape, or a circular shape, but the inventive concept is not limited to these examples. In an embodiment, the openings OP may be formed to have the circular shape.

Since the second mask pattern 602 is formed using the EUV lithography process, the minimum pitch of the openings OP, which are formed using the second mask pattern 602, may be less than or equal to 45 nm. That is, by using the EUV lithography process, it may be possible to accurately and finely form the openings OP, without a multi-patterning technology.

The openings OP may be spaced apart from each other in the first and second directions D1 and D2. A width of the openings OP in the second direction D2 may be larger than a distance between adjacent ones of the bit line spacers SP.

The storage node contacts BC may be formed by etching the preliminary storage node contacts BCa, which are exposed through the openings OP. The storage node contacts BC may be spaced apart from each other in the first and second directions D1 and D2. Each of the storage node contacts BC may be electrically connected to a corresponding one of the second impurity regions 110b.

As a result of the etching process, the storage node contacts BC may have top surfaces, which are located at a level lower than those of the preliminary storage node contacts BCa when measured from the bottom surface of the substrate 10 and are respectively exposed through the openings OP. The width of the openings OP in the second direction D2 may be larger than a width of the storage node contacts BC in the second direction D2.

Referring to FIGS. 22 to 25, the second ohmic pattern 341 may be formed on each of the storage node contacts BC on the cell region CR. The diffusion prevention pattern 342 may be conformally formed on (e.g., to conformally cover) the second ohmic pattern 341, the bit line spacer SP, the upper capping pattern 360, and the fence insulating pattern 340. Thereafter, a landing pad layer LPa, a third mask layer 603, and fourth mask patterns 604 may be sequentially formed on the diffusion prevention pattern 342.

A preliminary peripheral contact plug DCPa may be formed on the peripheral region PR. The formation of the preliminary peripheral contact plug DCPa may include forming holes to sequentially penetrate the fourth peripheral capping layer 360pa, the third peripheral capping pattern 353p, the lower peripheral insulating pattern 370, and an upper portion of the substrate 10, forming the second peripheral ohmic pattern 341p on the upper portion of the substrate 10, forming the peripheral diffusion prevention pattern 342p conformally on (e.g., to conformally cover) inner side surfaces of the holes and a top surface of the fourth peripheral capping layer 360pa, and forming the preliminary peripheral contact plugs DCPa in (e.g., to fill) remaining portions of the holes and on the top surface of the fourth peripheral capping layer 360pa. Thereafter, the third mask layer 603 and the fourth mask patterns 604 may be sequentially formed on the preliminary peripheral contact plug DCPa.

Referring back to FIGS. 2 to 5, the landing pads LP may be formed on the storage node contacts BC, respectively, which are formed on the cell region CR. The landing pad LP may be formed on the diffusion prevention pattern 342. The landing pads LP may be formed by etching the third mask layer 603 (FIGS. 23 and 24) and the landing pad layer LPa (FIGS. 23 and 24) using the fourth mask patterns 604 as an etch mask. Each of the landing pads LP may be electrically connected to a corresponding one of the storage node contacts BC.

The formation of the landing pads LP may further include separating the preliminary upper capping pattern 360b into the upper capping patterns 360, which are respectively disposed on the lower capping patterns 350. The upper capping patterns 360 may be formed such that each of them is interposed between a corresponding landing pad LP and a corresponding lower capping pattern 350.

The first interlayer insulating pattern 400 may be formed to enclose each of the landing pads LP. The first interlayer insulating pattern 400 may be formed in a region, which is formed by removing a portion of the landing pad layer LPa through an etching process for forming the landing pads LP. The first interlayer insulating pattern 400 may be formed to have a side surface that is in contact with a side portion of the upper capping pattern 360, an upper side portion of the lower capping pattern 350, an upper portion of the bit line spacer SP, and an upper side portion of the fence insulating pattern 340.

The bottom electrodes BE may be formed on the landing pads LP, respectively. The etch stop layer 420 may be formed on the first interlayer insulating pattern 400. The upper supporting pattern SS1 may be formed to support the upper side surfaces of the bottom electrodes BE, and the lower supporting pattern SS2 may be formed to support the lower side surfaces of the bottom electrodes BE. The dielectric layer DL may be formed on (e.g., to cover) the bottom electrodes BE and the upper and lower supporting patterns SS1 and SS2, and the top electrode TE may be formed on the dielectric layer DL in (e.g., to fill) a space between the bottom electrodes BE. The bottom electrodes BE, the dielectric layer DL, and the top electrode TE may constitute the capacitor CA.

The peripheral contact plugs DCP and the fourth peripheral capping pattern 360*p* may be formed on the peripheral region PR. The formation of the peripheral contact plugs DCP and the fourth peripheral capping pattern 360*p* may include etching a portion of the preliminary peripheral contact plug DCPa and a portion of the fourth peripheral capping layer 360*pa* and filling an empty region, which is formed by etching the portion of the preliminary peripheral contact plug DCPa and the portion of the fourth peripheral capping layer 360*pa*, with the upper peripheral insulating pattern 400*p*. A remaining portion of the preliminary peripheral contact plug DCPa may constitute the peripheral contact plugs DCP. A remaining portion of the fourth peripheral capping layer 360*pa* may constitute the fourth peripheral capping pattern 360*p*. The peripheral contact plugs DCP may be spaced apart from each other by the upper peripheral insulating pattern 400*p*. In the etching process, the third mask layer 603 and the fourth mask patterns 604 may be used as an etch mask. Thereafter, the second interlayer insulating pattern 500 may be formed on the peripheral contact plugs DCP and the upper peripheral insulating pattern 400*p*.

The formation of the landing pads LP and the peripheral contact plugs DCP may include performing a lithography process using EUV light. Accordingly, when viewed in a plan view, the fourth mask patterns 604 may have a line shape extended in a specific direction, an island shape, a zigzag shape, a honeycomb shape, or a circular shape, but the inventive concept is not limited to these examples. For the sake of brevity, features described with reference to the EUV lithography process of FIGS. 14 to 21 may be omitted in the following description.

Various failures may occur in a subsequent process according to the height of the capping pattern on the bit line BL. For example, in the case where the height of the capping pattern is excessively high, the line pattern 300 may be formed at a high height, and in this case, there may be a difficulty in etching the line patterns 300 to a bottom level in an etching process of the line patterns 300. Thus, adjacent ones of the preliminary storage node contacts BCa may be incompletely separated from each other in the first direction D1 and in this case, a short circuit may occur between the storage node contacts BCa. In addition, due to a high aspect ratio of the capping pattern, the capping pattern and the bit line BL may lean, before filling a space between adjacent ones of the bit lines BL with the line patterns 300.

By contrast, in the case where the height of the capping pattern is low, an upper portion of the metal-containing pattern 330 of the bit line BL may be exposed in the etching process for forming the landing pads LP. Particles on the exposed upper portion of the metal-containing pattern 330 may cause a failure in a subsequent process and may deteriorate electrical characteristics of the semiconductor device.

According to an embodiment of the inventive concept, the capping patterns on the bit lines BL may include the lower capping patterns 350 and the upper capping patterns 360. The lower capping patterns 350 and the upper capping patterns 360 may be separately formed through different processes, and the lower capping patterns 350 may be formed before the formation of the upper capping patterns 360. Meanwhile, the line patterns 300 may be formed after the formation of the lower capping patterns 350 and before the formation of the upper capping patterns 360. That is, the line patterns 300 may be formed when a height of the capping pattern is relatively low, and a height of the line pattern may be decreased. Accordingly, it may be possible to inhibit/prevent the capping patterns and the bit lines BL from leaning and to inhibit a short circuit from being formed between the storage node contacts BC in a subsequent step. In addition, since the upper capping patterns 360 are further formed before the formation of the landing pads LP, it may be possible to prevent the metal-containing pattern 330 from being damaged in a process of etching the landing pad layer LPa. As a result, it may be possible to improve electrical characteristics of the semiconductor device. Furthermore, since the lower and upper capping patterns 350 and 360 are formed separately, it may be possible to easily adjust the height of the capping patterns. Accordingly, it may be possible to easily fabricate the semiconductor device.

In addition, a distance between the upper capping patterns 360, which are adjacent to each other in the second direction D2, may be larger than a distance between adjacent ones of the bit line spacers SP. Accordingly, a width of an upper portion of the landing pad LP in the second direction D2 may be increased, and in this case, since the landing pads LP have a reduced resistance, electrical characteristics of the semiconductor device may be improved.

According to an embodiment of the inventive concept, capping patterns on bit lines may include lower capping patterns and upper capping patterns. Preliminary storage node contacts may be formed after the formation of the lower capping patterns and before the formation of the upper capping patterns, and thus, it may be possible to inhibit/prevent a short circuit from being formed between storage node contacts. In addition, since the upper capping patterns are formed before forming landing pads, it may be possible to inhibit/prevent a metal-containing pattern from being damaged. Accordingly, it may be possible to improve electrical characteristics of the semiconductor device. In addition, since the lower capping patterns and the upper capping patterns are separately formed through different processes, it may be possible to easily adjust heights of the capping patterns. Accordingly, it may be possible to easily fabricate the semiconductor device.

While example embodiments of the inventive concept have been particularly shown and described, it will be understood by one of ordinary skill in the art that variations in form and detail may be made therein without departing from the scope of the attached claims.

What is claimed is:
1. A semiconductor device, comprising:
a substrate including a cell region and a peripheral region;
bit lines on the cell region and extending in a first direction parallel to a top surface of the substrate;
storage node contacts between the bit lines;
landing pads on the storage node contacts, respectively;
a first interlayer insulating pattern at least partially surrounding each of the landing pads;
a respective lower capping pattern on a top surface of each of the bit lines;
a respective bit line spacer on a side surface of each of the bit lines and extending to a side surface of the respective lower capping pattern; and
a respective upper capping pattern on a top surface of the respective lower capping pattern,
wherein the respective bit line spacer includes a respective first sub-spacer and a respective second sub-spacer that are spaced apart from each other on the side surface of each of the bit lines, wherein the respective upper capping pattern is on at least a portion of a top surface of the respective first sub-spacer, and is on at least a portion of a top surface of the respective second sub-spacer, and wherein a bottom surface of the first interlayer insulating pattern is closer to a bottom surface of the substrate than a bottom surface of the respective upper capping pattern.

2. The semiconductor device of claim 1, wherein the respective bit line spacer is not on a side surface of the respective upper capping pattern.

3. The semiconductor device of claim 1, further comprising a respective air gap between the respective first sub-spacer and the respective second sub-spacer, wherein the respective upper capping pattern comprises silicon nitride.

4. The semiconductor device of claim 1, wherein the respective upper capping pattern comprises a single material.

5. The semiconductor device of claim 1, wherein a distance between the respective upper capping pattern on a first one of the bit lines and the respective upper capping pattern on a second one of the bit lines in a second direction that is parallel to the top surface of the substrate and is perpendicular to the first direction is larger than a distance between the respective bit line spacer on the side surface of the first one of the bit lines and the respective bit line spacer on the side surface of the second one of the bit lines in the second direction.

6. The semiconductor device of claim 1, wherein the bottom surface of the first interlayer insulating pattern is farther from the bottom surface of the substrate than the top surface of each of the bit lines.

7. The semiconductor device of claim 1, further comprising:

a peripheral word line on the peripheral region, the peripheral word line comprising a first peripheral capping pattern;

a lower peripheral insulating pattern on a side surface of the peripheral word line;

a second peripheral capping pattern on a top surface of the peripheral word line and between the side surface of the peripheral word line and the lower peripheral insulating pattern and between the substrate and the lower peripheral insulating pattern;

a third peripheral capping pattern on the lower peripheral insulating pattern and on the second peripheral capping pattern; and fourth peripheral capping patterns on the third peripheral capping pattern, wherein the fourth peripheral capping patterns comprise a same material as the respective upper capping pattern.

8. The semiconductor device of claim 7, wherein portions of the fourth peripheral capping patterns are on the peripheral word line, and wherein the first peripheral capping pattern, the second peripheral capping pattern, the third peripheral capping pattern, and the portions of the fourth peripheral capping patterns are sequentially stacked.

9. The semiconductor device of claim 7, wherein the first peripheral capping pattern, the second peripheral capping pattern, the third peripheral capping pattern, and the fourth peripheral capping patterns each comprise silicon nitride.

10. A semiconductor device, comprising:

a substrate;

bit lines on the substrate;

lower capping patterns on top of the bit lines;

upper capping patterns on top of the lower capping patterns;

bit line spacers on side surfaces of the bit lines, side surfaces of the lower capping patterns, and bottom surfaces of the upper capping patterns, wherein at least one of the bit line spacers includes a first sub-spacer and a second sub-spacer that are spaced apart from each other on a side surface of a respective one of the bit lines; and an air gap between the first sub-spacer and the second sub-spacer, wherein the bit line spacers are not on side surfaces of the upper capping patterns, and wherein a top surface of the air gap is coplanar with at least one of a top surface of the first sub-spacer or a top surface of the second sub-spacer.

11. The semiconductor device of claim 10, wherein a top surface of a first lower capping pattern of the lower capping patterns is coplanar with a top surface of a first bit line spacer of the bit line spacers.

12. The semiconductor device of claim 10, wherein the bottom surfaces of the upper capping patterns contact the lower capping patterns and the bit line spacers, and wherein the upper capping patterns include silicon nitride.

13. The semiconductor device of claim 10, wherein the bottom surfaces of the upper capping patterns contact top surfaces of the bit line spacers.

14. The semiconductor device of claim 10, wherein a distance between two of the upper capping patterns that are adjacent to each other is larger than a distance between two of the bit line spacers that are adjacent to each other.

15. The semiconductor device of claim 10, wherein top surfaces of the lower capping patterns are narrower than the bottom surfaces of the upper capping patterns.

16. The semiconductor device of claim 10, further comprising a first interlayer insulating pattern on the at least one of the bit line spacers, wherein a side surface of the first interlayer insulating pattern is in direct contact with at least one of the lower capping patterns.

17. The semiconductor device of claim 10, further comprising a first interlayer insulating pattern on the at least one of the bit line spacers, wherein a side surface of the first interlayer insulating pattern is in contact with at least one of the upper capping patterns, and wherein the at least one of the upper capping patterns includes a first material, and the first interlayer insulating pattern includes a second material different from the first material.

18. A semiconductor device, comprising:

a substrate including a peripheral region;

a peripheral gate structure on the peripheral region, the peripheral gate structure comprising a first peripheral capping pattern;

a lower peripheral insulating pattern on the substrate and on a side surface of the peripheral gate structure;

a second peripheral capping pattern on a top surface of the peripheral gate structure and between the side surface of the peripheral gate structure and the lower peripheral insulating pattern and between the substrate and the lower peripheral insulating pattern;

a third peripheral capping pattern on the lower peripheral insulating pattern and on the second peripheral capping pattern;

fourth peripheral capping patterns on the third peripheral capping pattern; and an upper peripheral insulating pattern between the fourth peripheral capping patterns, wherein the first peripheral capping pattern, the second peripheral capping pattern, the third peripheral capping pattern, and the fourth peripheral capping patterns include a same material, and wherein a bottom surface of the upper peripheral insulating pattern is closer to a bottom surface of the substrate than bottom surfaces of the fourth peripheral capping patterns and is farther from the bottom surface of the substrate than a bottom surface of the third peripheral capping pattern.

19. The semiconductor device of claim 18, further comprising:

a peripheral active pattern on the peripheral region of the substrate;

a peripheral spacer between the side surface of the peripheral gate structure and the second peripheral capping pattern; and a peripheral contact plug that extends into the upper peripheral insulating pattern, the fourth peripheral capping patterns, the third peripheral capping pattern, the lower peripheral insulating pattern, and the second peripheral capping pattern, wherein the peripheral contact plug is electrically connected to the peripheral active pattern.

20. The semiconductor device of claim 18, wherein the first peripheral capping pattern, the second peripheral capping pattern, the third peripheral capping pattern, and the fourth peripheral capping patterns each include silicon nitride.

* * * * *